(12) United States Patent
Furukawa et al.

(10) Patent No.: US 10,847,614 B2
(45) Date of Patent: Nov. 24, 2020

(54) SEMICONDUCTOR DEVICE HAVING A STACKED ELECTRODE WITH AN ELECTROLESS NICKEL PLATING LAYER

(71) Applicant: Hitachi Power Semiconductor Device, Ltd., Hitachi (JP)

(72) Inventors: Tomoyasu Furukawa, Tokyo (JP); Toshiaki Morita, Tokyo (JP); Daisuke Kawase, Hitachi (JP); Toshihito Tabata, Hitachi (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 0 days.

(21) Appl. No.: 16/450,252

(22) Filed: Jun. 24, 2019

(65) Prior Publication Data

US 2020/0075722 A1 Mar. 5, 2020

(30) Foreign Application Priority Data

Aug. 28, 2018 (JP) .................................. 2018-159171

(51) Int. Cl.

| H01L 29/08 | (2006.01) |
|---|---|
| H01L 29/73 | (2006.01) |
| H01L 29/739 | (2006.01) |
| H01L 23/00 | (2006.01) |
| H01L 21/288 | (2006.01) |

(52) U.S. Cl.
CPC ........ *H01L 29/0834* (2013.01); *H01L 21/288* (2013.01); *H01L 24/33* (2013.01); *H01L 29/7397* (2013.01); *H01L 2924/01028* (2013.01); *H01L 2924/01029* (2013.01)

(58) Field of Classification Search
CPC .. H01L 29/0834; H01L 29/7397; H01L 24/33
See application file for complete search history.

(56) References Cited

U.S. PATENT DOCUMENTS

| 3,599,060 | A | * | 8/1971 | Triggs | ................... | H01L 21/288 257/751 |
|---|---|---|---|---|---|---|
| 6,136,702 | A | * | 10/2000 | Chandross | ............ | H01L 21/288 257/E21.174 |
| 6,555,411 | B1 | * | 4/2003 | Bao | ..................... | H01L 51/0021 257/E21.175 |
| 6,787,442 | B2 | * | 9/2004 | Hayashida | ........... | H05K 3/3463 438/612 |
| 2008/0237851 | A1 | | 10/2008 | Morita et al. | | |

(Continued)

FOREIGN PATENT DOCUMENTS

| JP | 5006081 B2 | 8/2012 |
|---|---|---|
| JP | 5669780 B2 | 2/2015 |
| JP | 2015-56532 A | 3/2015 |

*Primary Examiner* — Ida M Soward
(74) *Attorney, Agent, or Firm* — Crowell & Moring LLP

(57) ABSTRACT

A semiconductor device including: a semiconductor element; and a first electrode formed on a first surface of the semiconductor element. The first electrode has a stacked structure including a first electroless Ni plating layer. The first electroless Ni plating layer contains nickel (Ni) and phosphorus (P) as a composition. A phosphorus (P) concentration of the first electroless Ni plating layer is 2.5 wt % to 6 wt % inclusive, and a crystallization rate of $Ni_3P$ in the first electroless Ni plating layer is 0% to 20% inclusive.

16 Claims, 18 Drawing Sheets

(56) References Cited

U.S. PATENT DOCUMENTS

| | | | |
|---|---|---|---|
| 2013/0307133 A1* | 11/2013 | Toba | H01L 33/0093 257/677 |
| 2014/0001636 A1* | 1/2014 | Saito | C23C 18/1653 257/753 |
| 2014/0117549 A1* | 5/2014 | Tsunami | C23C 18/1653 257/751 |
| 2015/0069613 A1* | 3/2015 | Shiraishi | H01L 29/7397 257/766 |
| 2017/0108594 A1* | 4/2017 | Murakami | H01L 27/144 |
| 2019/0035735 A1* | 1/2019 | Fitzsimmons | H01L 21/02529 |

* cited by examiner

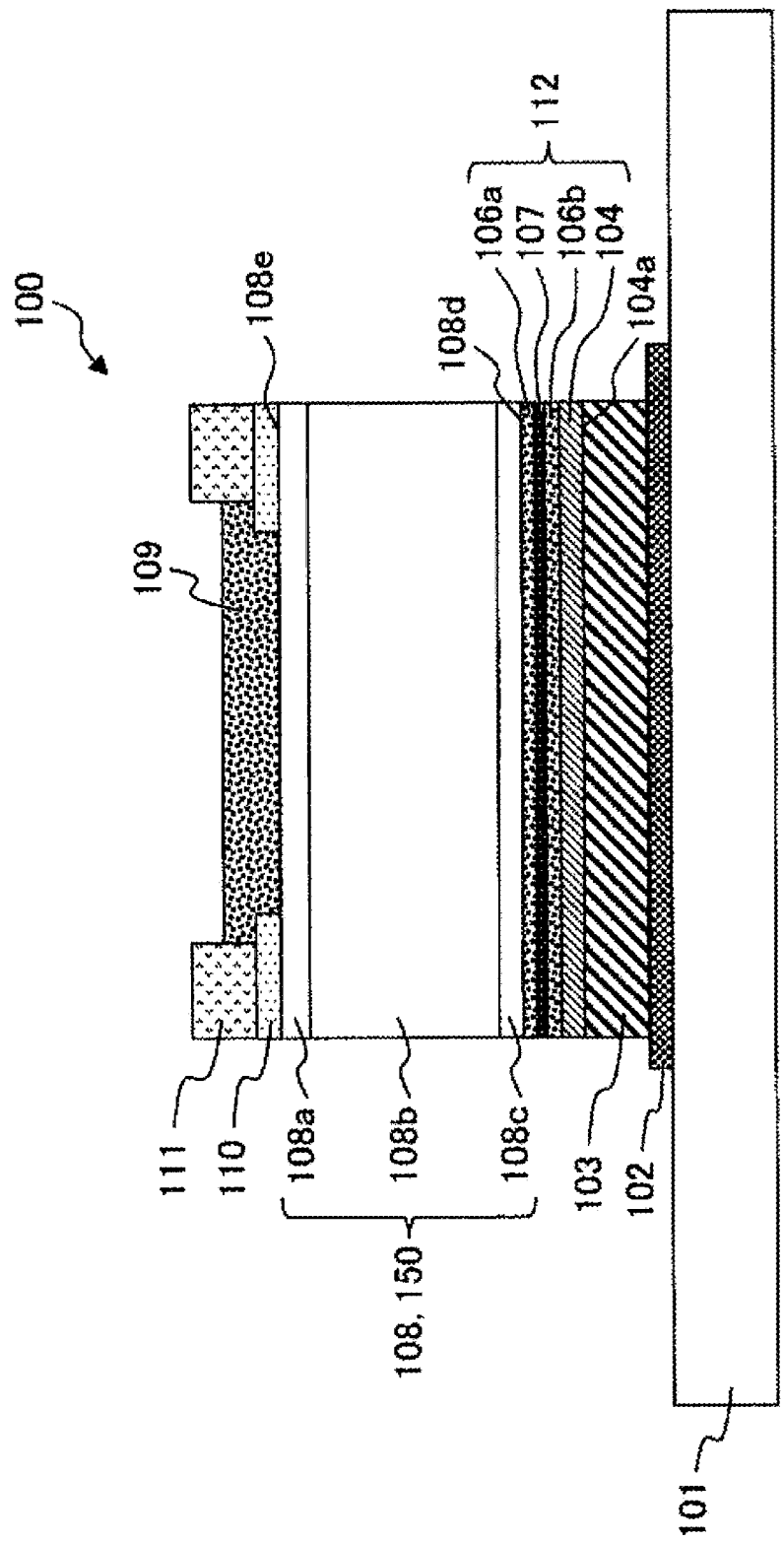

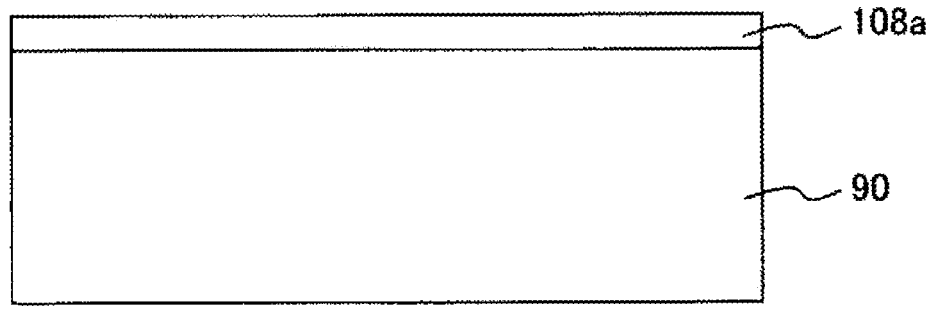
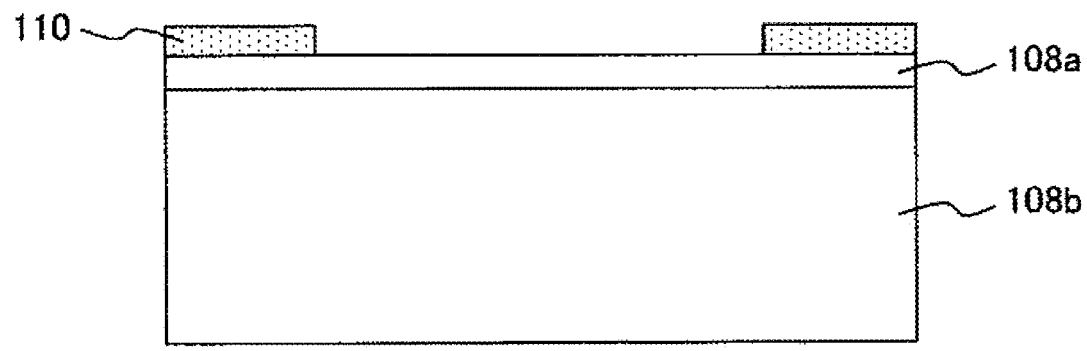
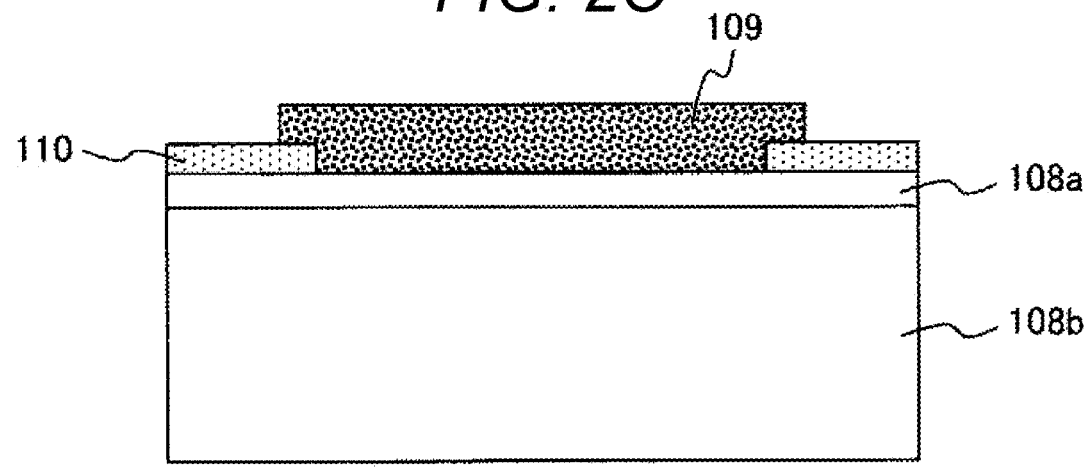

| No | STEP |
|---|---|
| 1 | CLEANER |
| 2 | ETCHING |
| 3 | ACID WASHING |
| 4 | FIRST ZINCATE |
| 5 | ACID WASHING |
| 6 | SECOND ZINCATE |
| 7 | ELECTROLESS Ni PLATING |

SEMICONDUCTOR DEVICE HAVING A STACKED ELECTRODE WITH AN ELECTROLESS NICKEL PLATING LAYER

CLAIM OF PRIORITY

The present application claims priority from Japanese Patent application serial no. 2018-159171, filed on Aug. 28, 2018, the content of which is hereby incorporated by reference into this application.

BACKGROUND OF THE INVENTION

1. Field of the Invention

The present invention relates to a structure of a semiconductor device and a manufacturing method thereof, and particularly to a technique advantageous for miniaturization and high reliability of a power conversion apparatus on which a semiconductor device is mounted.

2. Description of the Related Art

Semiconductor devices have been used in a wide range of fields such as system large scale integration (LSI), power conversion apparatuses, and control devices for hybrid vehicles. In such semiconductor devices, "solder" or a "solder alloy" containing lead has been mainly used, for example, for electrical junction between an electrode terminal of an electronic component and an electrode terminal of a circuit pattern on a circuit board.

Meanwhile, the use of lead is severely restricted from the viewpoint of protecting the global environment, and development to restrict the use of lead and join an electrode or the like with a lead-free material has been advanced. In particular, an effective material as an alternative to "high-temperature solder" has not yet been found. Since it is indispensable to use "lead-free solder hierarchy" in a technique of mounting semiconductor devices, there is a demand for the appearance of materials substituting for the "high-temperature solder".

Further, cost reduction and size reduction are required in a power module which is a main component of a power converter such as an inverter. Similarly, cost reduction and size reduction are also required in a power device chip in the power module, and there is a request for a new technique of realizing a high-output current density of the power device chip. With the high-output current density, a loss per unit chip area of the power device increases, and a chip temperature rises. Thus, a highly reliable package mounting technique capable of operating at a high temperature is required even if a loss density increases.

Based on such a background, a joining material, which joins electrodes using a composite material of metal particles and an organic compound as a high-temperature and high-reliability material, has been proposed instead of the "high-temperature solder".

For example, JP 5006081 B2 discloses "a semiconductor device that forms a junction under reducing atmosphere using a joining material containing a reducing agent formed of cupric oxide (CuO) particles and an organic substance as a joining technique that can provide excellent joining strength with respect to a Ni or Cu electrode".

In the semiconductor device described in JP 5006081 B2, copper particles of 100 nm or smaller are generated during heating and reduction, and the copper particles are sintered and joined. The joining technique using the cupric oxide (CuO) particle described in JP 5006081 B2 can improve a joining property with respect to Ni and Cu as compared with the conventional nanoparticle joining, and thus, can be expected as the joining material for the Ni electrode or Cu electrode.

For example, the Ni electrode of a power semiconductor chip such as an insulated gate bipolar transistor (IGBT) and a freewheel diode used for an inverter of a power conversion apparatus can be electrically connected to a connection terminal via a junction layer formed of a copper sintered layer.

The Ni electrode of the power semiconductor chip is formed by a Ni electrode formation method of growing a Ni layer on a surface of Al metal, for example, by an electroless plating method.

Further, J P 2015-56532 A discloses "a semiconductor device formed by an electroless plating method and having a Ni electrode". The semiconductor device described in JP 2015-56532 A includes a Ni plating layer as a first layer having a low phosphorus concentration and a Ni plating layer as a second layer having a high phosphorus concentration on a semiconductor chip, and the phosphorus concentration of the Ni plating layer as the first layer is set to equal to or higher than 4 wt % and lower than 6 wt %. When the phosphorus concentration of the Ni plating layer is low, hardening caused by precipitation of an alloy of nickel and phosphorus (for example, $Ni_3P$) hardly occurs even when heat treatment is performed, and a crack is hardly generated in a plating film. Further, it is described that the plating film entirely crystallizes by heat treatment.

Further, JP 5669780 B2 discloses "a semiconductor device having a Ni/Au electrode formed by an electroless plating method". In the semiconductor device described in JP 5669780 B2, a Ni plating layer is made amorphous to enhance reliability without a change of a crystal structure accompanying a temperature or stress change or a crack in a plating film due to generation of a grain boundary void.

SUMMARY OF THE INVENTION

As a result of studies conducted by the inventors of the present application, however, it has been found that a crack is likely to occur depending on a type of an electroless Ni plating bath and a heat treatment condition after plating deposition even in the case where the phosphorus concentration is equal to or higher than 4 wt % and lower than 6 wt % as in JP 2015-56532 A. If a crack is generated in the electroless Ni plating film, there is a possibility that the crack may develop depending on a temperature and stress change to cause characteristic defects.

When a semiconductor chip is electrically connected to a connection terminal using a junction layer formed of a copper sintered layer, copper diffuses from the junction layer to the power semiconductor chip if a crack is generated in an electroless Ni plating electrode of the semiconductor chip, and there are problems that an element leak current increases, an element withstand voltage deteriorates, and characteristics of the element fluctuate.

Therefore, an object of the present invention is to provide a highly reliable semiconductor device which has an electrode including an electroless Ni plating layer and in which a crack is hardly generated in the electroless Ni plating layer, and a manufacturing method thereof.

In order to solve the above problem, an aspect of the present invention is a semiconductor device including: a semiconductor element; and a first electrode formed on a first surface of the semiconductor element. The first electrode has a stacked structure including a first electroless Ni plating layer. The first electroless Ni plating layer contains nickel (Ni) and phosphorus (P) as a composition. A phosphorus (P) concentration of the first electroless Ni plating layer is 2.5 wt % to 6 wt % inclusive, and a crystallization rate of $Ni_3P$ in the first electroless Ni plating layer is 0% to 20% inclusive.

Further, another aspect of the present invention is a power conversion apparatus including: a pair of DC terminals; AC terminals as many as the number of phases of an AC output; switching legs as many as the number of the phases of the AC output, the switching legs connected between the pair of DC terminals such that two parallel circuits each having a switching element and a diode having a polarity opposite to a polarity of the switching element are connected in series; and a gate circuit which controls the switching element. The switching element is the semiconductor device having the above-described features.

According to the present invention, it is possible to realize the highly reliable semiconductor device which has the electrode including the electroless Ni plating layer and in which the crack is hardly generated in the electroless Ni plating layer, and the manufacturing method thereof.

As a result, it is possible to reduce a size and increase reliability of a power conversion apparatus on which the semiconductor device is mounted.

Other objects, configurations, and effects which have not been described above become apparent from embodiments to be described hereinafter.

BRIEF DESCRIPTION OF THE DRAWINGS

FIG. 1 is a cross-sectional view of a semiconductor device according to a first embodiment of the present invention;

FIGS. 2A to 2C are cross-sectional views of steps in a manufacturing method of the semiconductor device according to the first embodiment of the present invention;

DESCRIPTION OF THE PREFERRED EMBODIMENTS

Figure 3A:
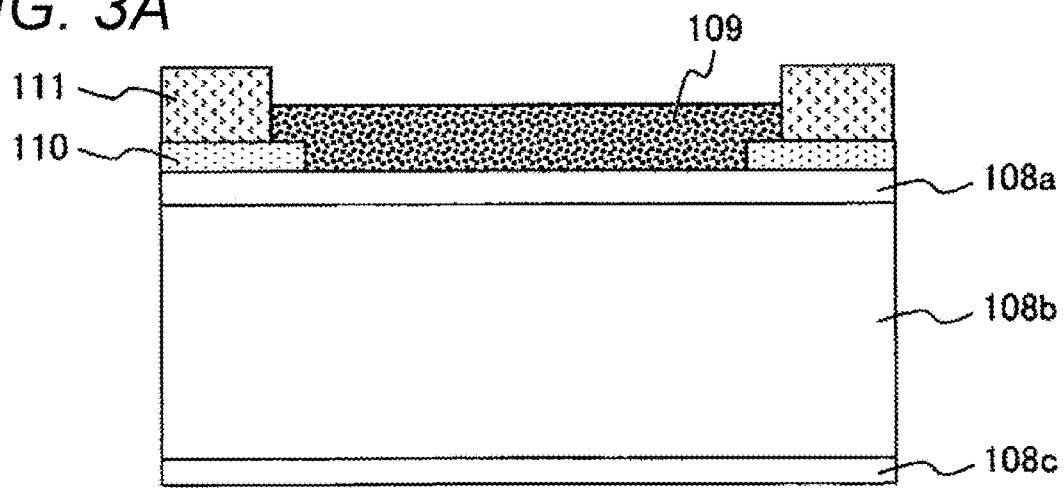
FIGS. 3A to 3C are cross-sectional views of steps in the manufacturing method of the semiconductor device according to the first embodiment of the present invention.

Hereinafter, embodiments of the present invention will be described with reference to the drawings. Incidentally, the same configurations in the respective drawings will be denoted by the same reference signs, and detailed descriptions of the overlapping parts will be omitted.

First Embodiment

A semiconductor device and a manufacturing method thereof according to a first embodiment of the present invention will be described with reference to FIGS. 1 to 15. FIG. 1 is a cross-sectional view of the semiconductor device according to the first embodiment of the present invention, and illustrates a sectional structure in the case of being applied to a freewheel diode of a power semiconductor chip. Although a description will be given assuming a diode using an n type Si substrate hereinafter, the invention is not limited thereto. Even when a p type Si substrate is used, the invention can be handled in the same manner. Further, the invention can be handled in the same manner in an electrode structure of an IGBT that causes a current to flow in the vertical direction. Further, the invention can be handled in the same manner regarding a wide-gap semiconductor such as SiC, GaN, and GaO.

As illustrated in FIG. 1, a semiconductor device 100 of the embodiment includes a semiconductor substrate 108 made of n type Si. The semiconductor substrate 108 includes, in order from a front surface (from an upper layer side to a lower layer side in FIG. 1), a p type semiconductor layer 108a, an n⁻ type drift layer 108b, and an n⁺ type semiconductor layer 108c formed of a high-concentration n-type impurity region, thereby forming a semiconductor element 150 formed of these semiconductor layers. The semiconductor substrate 108 includes a first surface 108d on which an electrode structural body (cathode electrode) 112 of a first semiconductor chip is formed and a second surface 108e on which an anode electrode 109 is formed.

The semiconductor device 100 includes: the electrode structural body (cathode electrode) 112 of a first semiconductor chip that is electrically connected to the semiconductor element 150 on the first surface 108d of the n$^+$ type semiconductor layer 108c of the semiconductor substrate 108 on which the semiconductor element 150 is formed and includes a first Al metal layer 106a made of Al or an Al alloy, a Cu diffusion prevention layer 107, a second Al metal layer 106b made of Al or an Al alloy, and a Ni layer 104 which are formed in this order (from an upper layer side to a lower layer side of FIG. 1); and a conductive member 102 that is arranged on a surface 104a of the Ni layer 104 and is joined to the electrode structural body 112 of the first semiconductor chip with a copper sintered layer 103 interposed therebetween.

Here, the Ni layer 104 is an electroless Ni plating layer and contains nickel (Ni) and phosphorus (P) as a composition, and a concentration of phosphorus (P) is 2.5 wt % to 6 wt % inclusive. Further, a crystallization rate of nickel (Ni) in the Ni layer (electroless Ni plating layer) 104 is 70% to 95% inclusive, and a crystallization rate of Ni$_3$P which is a compound of nickel (Ni) and phosphorus (P) is 0% to 20% inclusive.

Incidentally, the first semiconductor chip includes the semiconductor substrate 108 and the electrode structural body (cathode electrode) 112 of the first semiconductor chip. The first Al metal layer 106a, the Cu diffusion prevention layer 107, the second Al metal layer 106b, and the Ni layer 104 are formed in this order (from the upper layer side to the lower layer side of FIG. 1) to form the cathode electrode 112 which is the electrode structural body on a back side of the semiconductor substrate 108. The cathode electrode 112 is joined to the conductive member 102 on a ceramic insulating substrate 101 using the copper sintered layer 103.

The anode electrode 109 on the second surface 108e side of the semiconductor substrate 108 has an electrode structure made of Al or an Al alloy, and has a part in contact with the p type semiconductor layer 108a of the semiconductor substrate 108 and the other part in contact with the insulating oxide film 110. Further, a passivation film 111 is formed on the insulating oxide film 110. The passivation film 111 is made of, for example, polyimide.

[Manufacturing Method of Semiconductor Device 100]

Next, a manufacturing method of the semiconductor device 100 of the present embodiment illustrated in FIG. 1 will be described with reference to FIGS. 2A to 3C. FIGS. 2A to 3C are views illustrating each step of the manufacturing method of the semiconductor device 100.

<Production Step of Semiconductor Element 150>

FIG. 2A is a cross-sectional view after formation of an anode p type semiconductor region according to the embodiment.

First, a Si wafer 90 for production of a diode is prepared. As the Si wafer, a wafer having a specific resistance in accordance with a withstand voltage can be used. For example, the specific resistance can be set to about 120 Ωcm for a diode having a withstand voltage of 1700 V and to about 250 Ωcm for a diode having a withstand voltage of 3.3 kV. At this time, the Si wafer 90 has a high specific resistance and serves a role as an n$^-$ layer. Hereinafter, the Si wafer 90 on which the p type semiconductor layer 108a is formed is referred to as an n$^-$ type drift layer 108b.

In an initial step (not illustrated), an oxide film is formed on the entire surface of the Si substrate 90 by thermal oxidation. Next, a photolithography step is performed to form a region where the p type semiconductor layer 108a is to be provided. In this photolithography step, the surface of the Si substrate 90 is coated with a resist material, and then, is exposed and developed, thereby forming a resist with an opening for the region of the p type semiconductor layer 108a. Thereafter, a p-type impurity is ion-implanted. Examples of the p-type impurity include boron. Thereafter, the resist is removed, and annealing to activate the impurity is performed, whereby the p type semiconductor layer 108a is formed as illustrated in FIG. 2A.

FIG. 2B is a cross-sectional view after formation of a contact portion according to the embodiment, and FIG. 2C is a cross-sectional view after formation of the anode electrode.

Next, on the surface (main surface) of the Si substrate 90, a silicon oxide film is formed by thermal oxidation, and the insulating oxide film 110 is deposited by a chemical vapor deposition (CVD) method. Then, the photolithography step is performed to form the contact portion that connects the p type semiconductor layer 108a and the anode electrode 109 (see FIG. 2C). After applying a resist material to a surface of the insulating oxide film 110, the insulating oxide film 110 is etched using a resist pattern formed by exposure and development as a mask, whereby a contact portion connecting the p type semiconductor layer 108a and the anode electrode is formed as illustrated in FIG. 2B.

Next, the anode electrode 109 made of Al or an Al alloy is formed by a sputtering method, and a resist is patterned and etched by a photolithography step, whereby the anode electrode 109 is formed as illustrated in FIG. 2C.

Next, the passivation film 111 (see FIGS. 3A to 3C) which is a surface protective film is formed. As a method of forming the protective film, for example, a solution containing a precursor material of polyimide and a photosensitive material is applied, and a termination region is exposed to polyimide the precursor, whereby it is possible to form the passivation film (surface protective film) 111.

Next, a manufacturing step on the back surface cathode side will be described.

<Production Step on Back Surface Cathode Side>

FIG. 3A is a cross-sectional view after formation of a back surface n$^+$ type semiconductor layer during formation of the surface protective film according to the embodiment.

First, a back surface of the n$^-$ type drift layer 108b is ground to reduce a wafer thickness. The wafer thickness is different in accordance with a withstand voltage, and is, for example, about 190 μm for a product having a withstand voltage of 1700 V and about 400 μm for a product having a withstand voltage of 3300 V.

Thereafter, ion-implantation of an n-type impurity is performed from the back surface side of the n$^-$ type drift layer 108b to the entire surface of the wafer. Examples of the n-type impurity include phosphorus (P), arsenic (As), and the like.

Next, laser annealing is performed to activate the ion-implanted n-type impurity, whereby the n$^+$ type semiconductor layer 108c is formed.

<Production Step of Back Surface Cathode Electrode 112>

Next, a method for manufacturing the cathode electrode 112 on the back surface will be described.

Figure 3B:
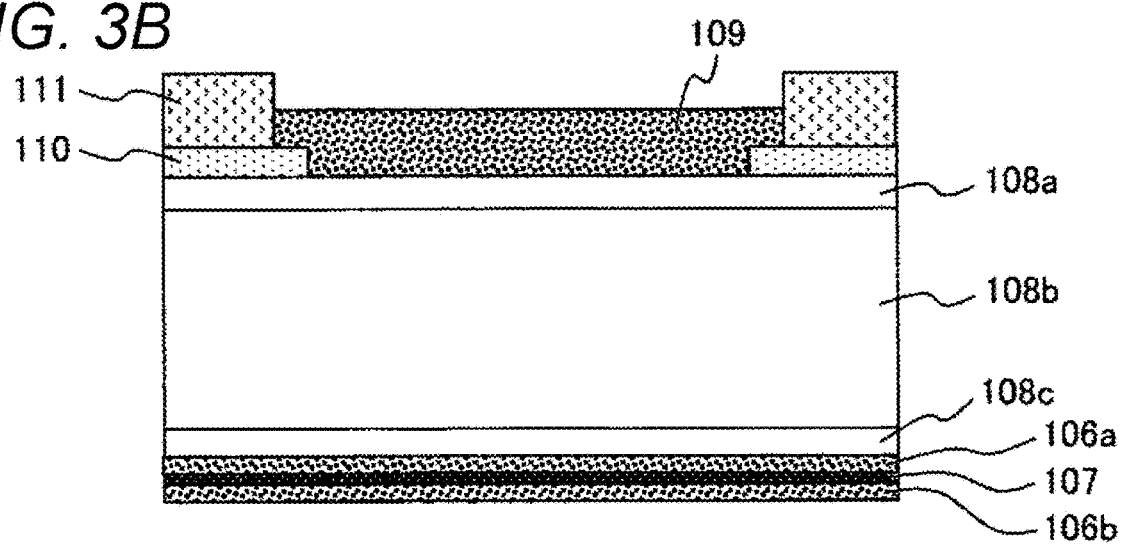

FIG. 3B is a cross-sectional view after formation of the cathode electrode 112 on the back surface according to the embodiment.

The cathode electrode 112 is formed by sputtering such that the first Al metal layer 106a of the back surface electrode having, for example, 0.6 μm of an AlSi alloy, the Cu diffusion prevention layer 107 having, for example, 0.2 µm of titanium (Ti), and the second Al metal layer 106b having, for example, 2 µm of an AlSi alloy are sequentially deposited.

Since the Cu diffusion prevention layer 107 made of titanium (Ti) is provided in the cathode electrode 112 on the back surface, when the semiconductor device is electrically connected to a connection terminal using a junction layer formed of the copper sintered layer 103 to be described later, copper is prevented from diffusing from the junction layer to the first semiconductor chip (the p type semiconductor layer 108a, the n⁻ type drift layer 108b, and the n⁺ type semiconductor layer 108c), and long-term joining reliability is improved.

Although titanium (Ti) is used for the Cu diffusion prevention layer 107 in the present embodiment, for example, materials such as titanium nitride (TiN), titanium tungsten (TiW), and tungsten (W), capable of forming the Cu diffusion prevention layer while ensuring conductivity, can be similarly used.

<Production Step of Ni Layer 104>

Figure 3C:
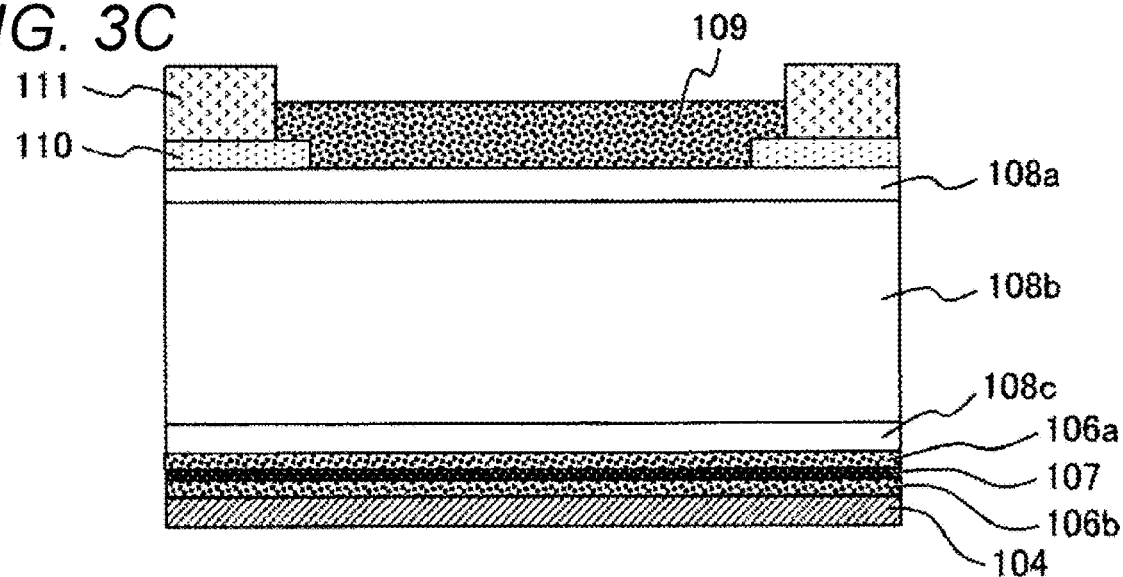

FIG. 3C is a cross-sectional view after formation of the Ni layer 104 according to the embodiment.

Figures 4, 5:
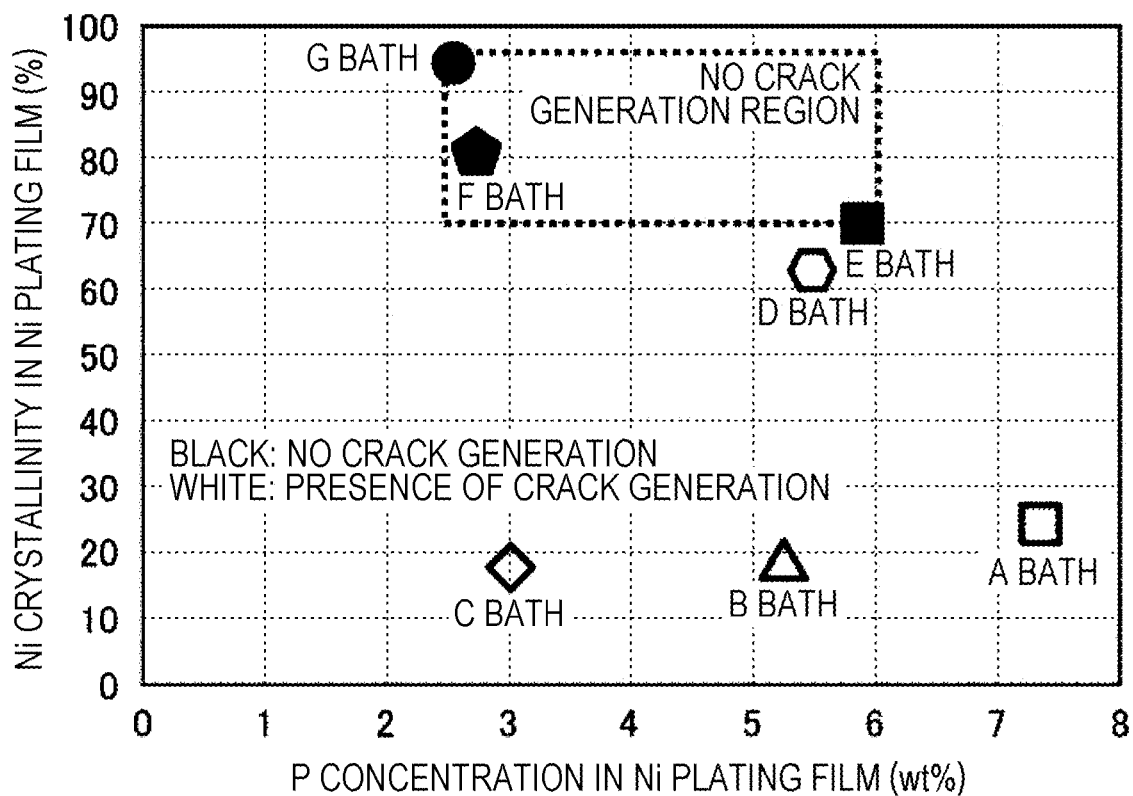
FIG. 4 is a view illustrating process flow of electroless Ni plating according to the first embodiment of the present invention.
FIG. 5 is a characteristic view illustrating a relationship among a phosphorus concentration, a Ni crystallinity, and crack generation in a Ni plating film of electroless Ni plating according to the first embodiment of the present invention.
Figure 6:
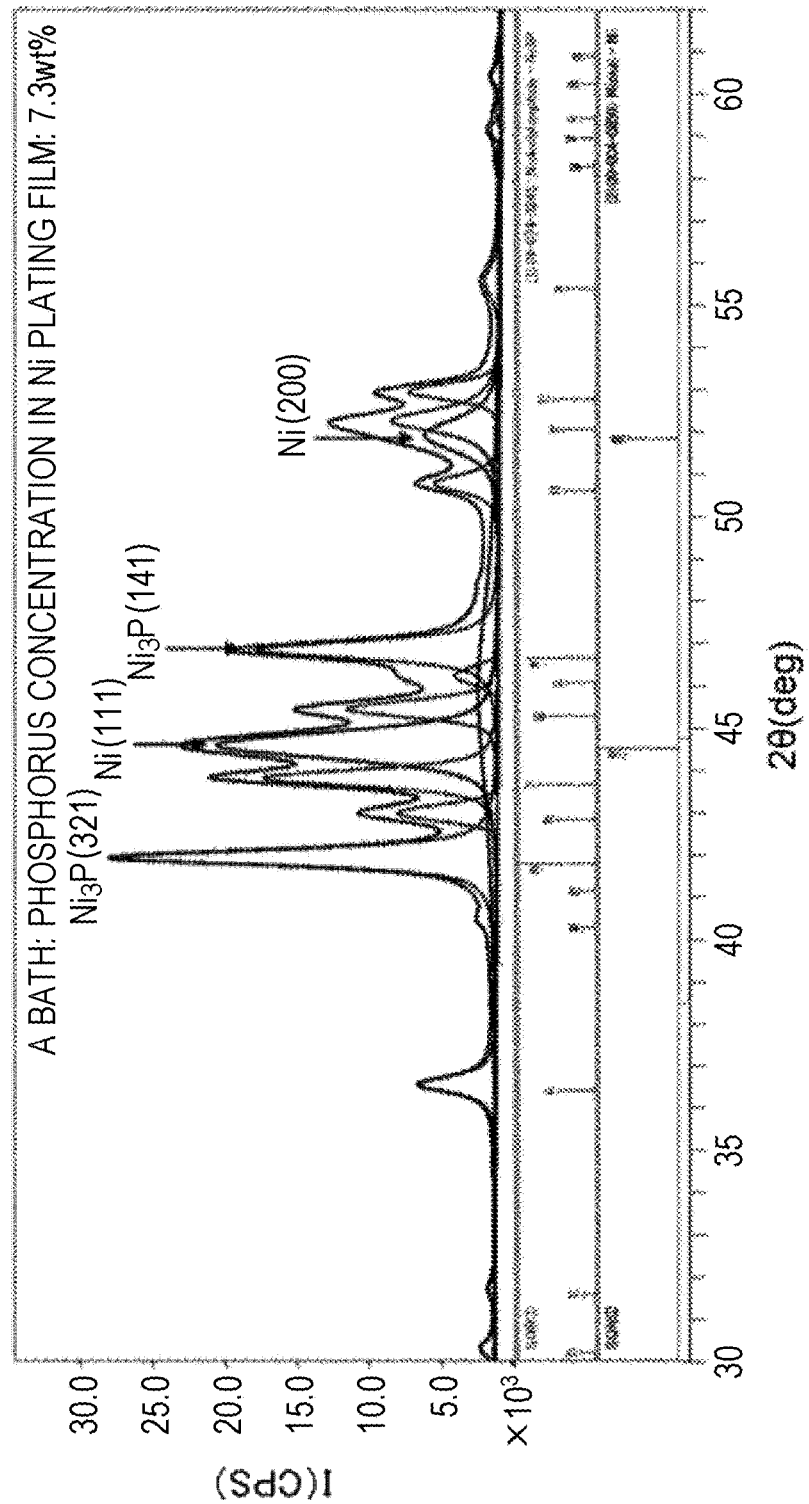
FIG. 6 is an X-ray diffraction profile fitting view of electroless Ni plating (A bath) according to the first embodiment of the present invention.
Figure 7:
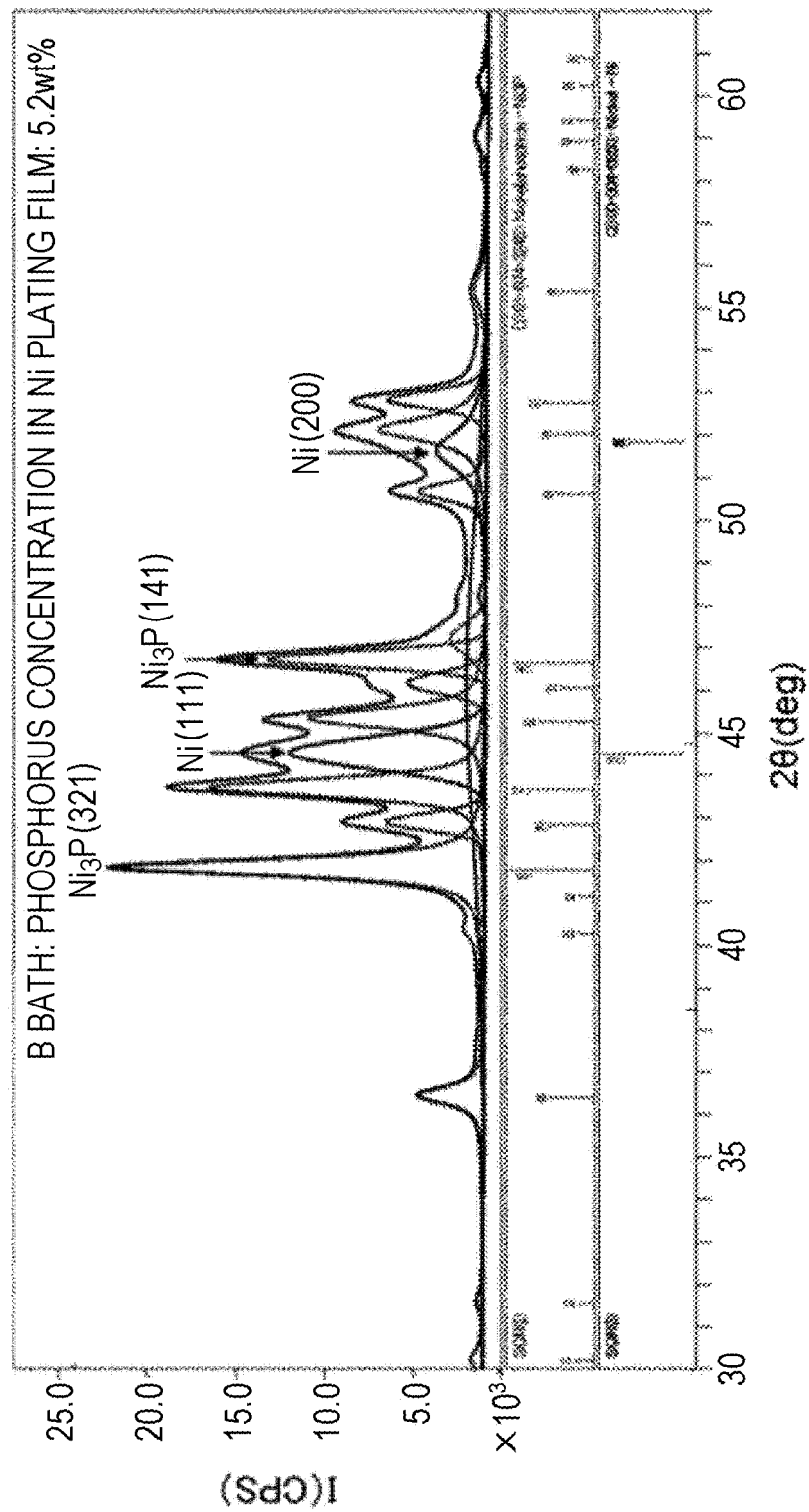
FIG. 7 is an X-ray diffraction profile fitting view of electroless Ni plating (B bath) according to the first embodiment of the present invention.
Figure 8:
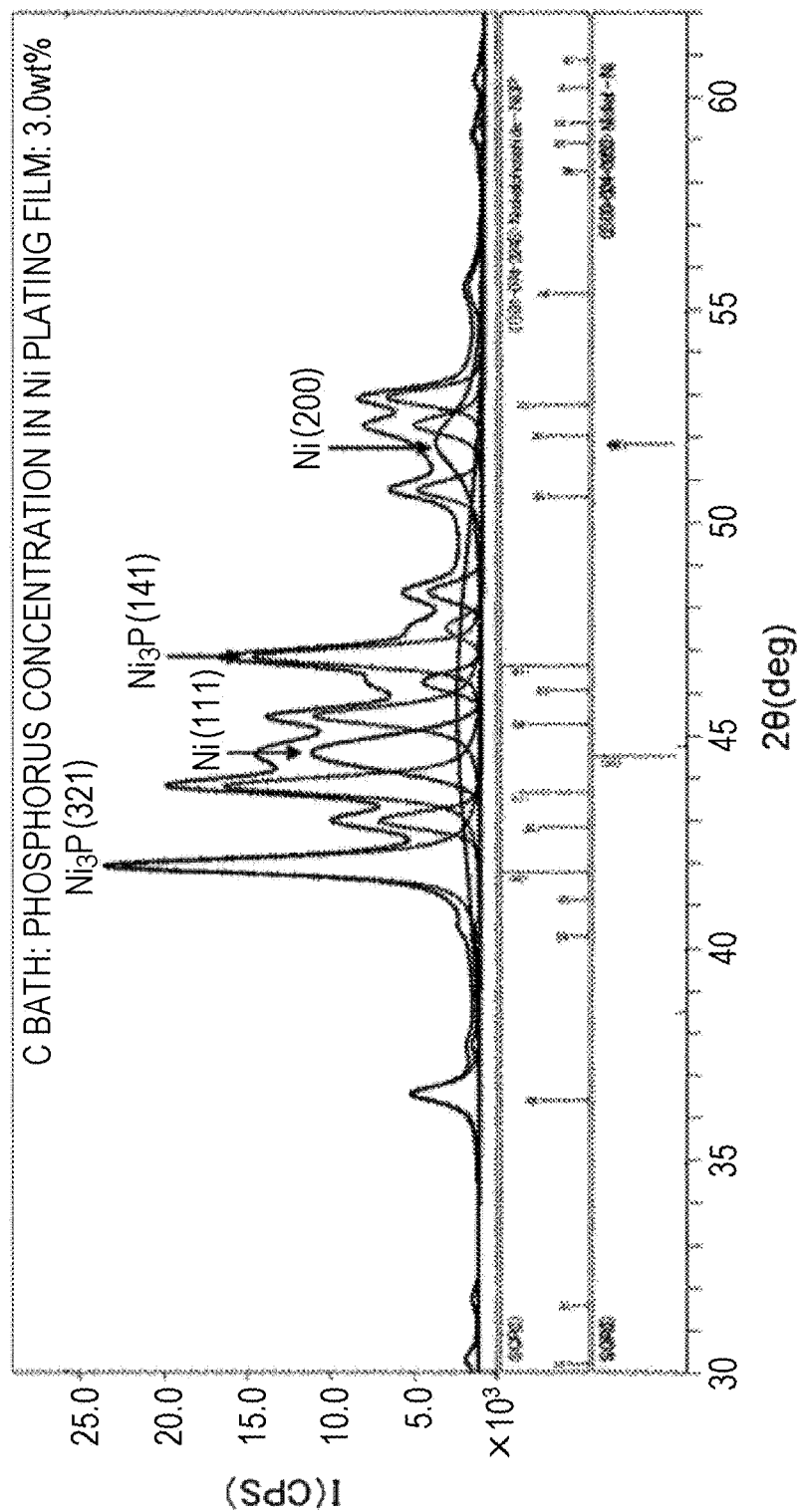
FIG. 8 is an X-ray diffraction profile fitting view of electroless Ni plating (C bath) according to the first embodiment of the present invention.
Figure 9:
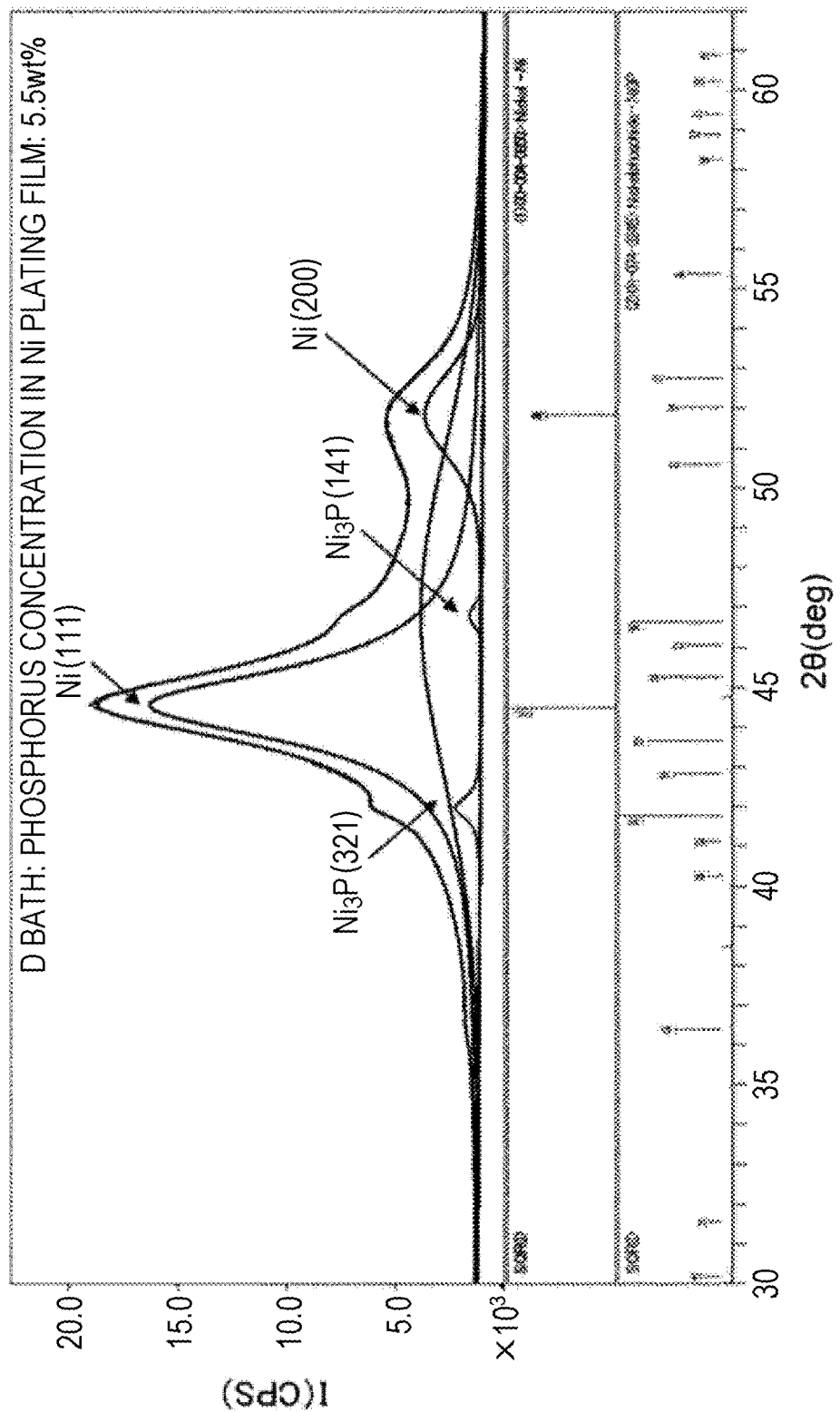
FIG. 9 is an X-ray diffraction profile fitting view of electroless Ni plating (D bath) according to the first embodiment of the present invention.
Figure 10:
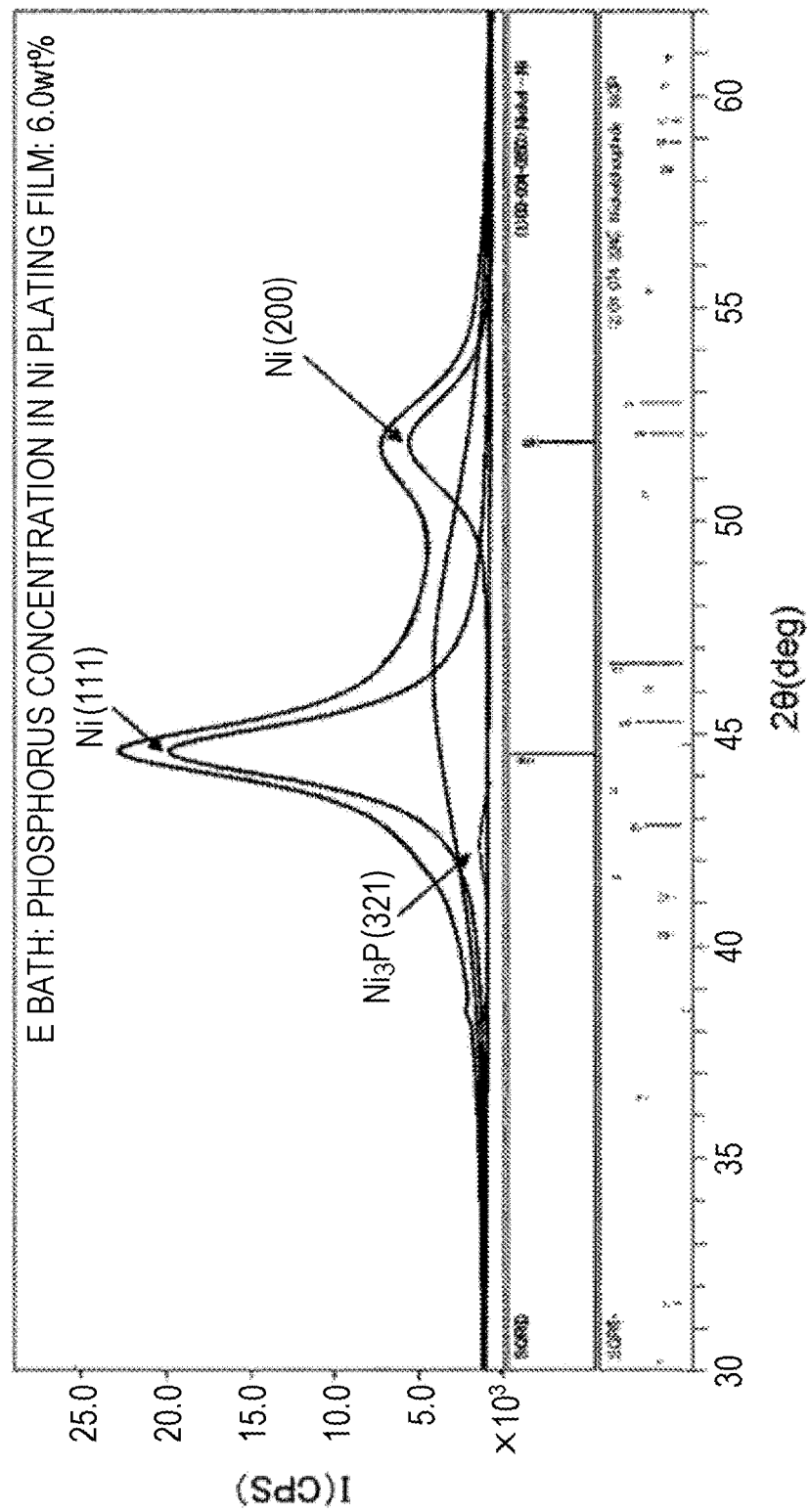
FIG. 10 is an X-ray diffraction profile fitting view of electroless Ni plating (E bath) according to the first embodiment of the present invention.
Figure 11:
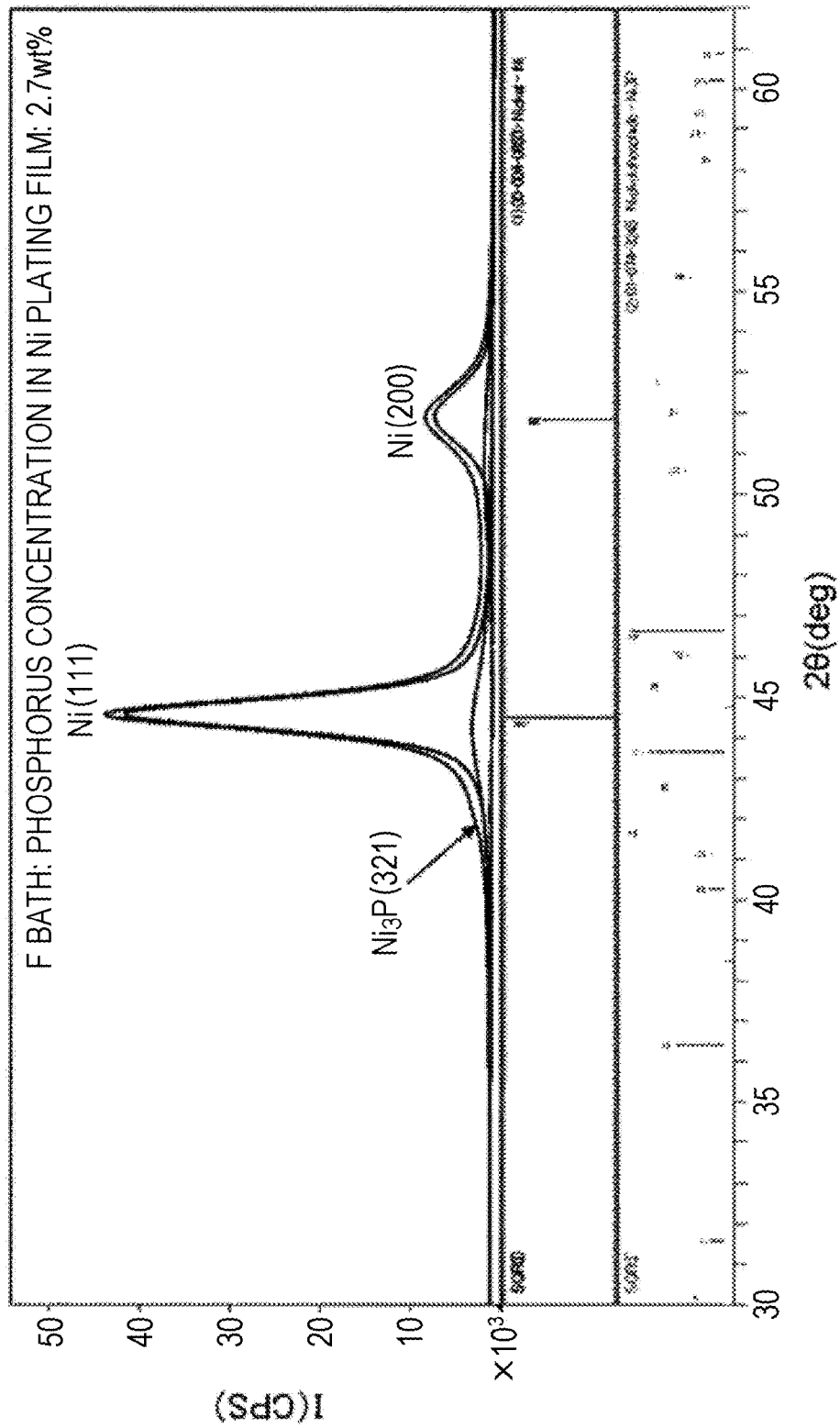
FIG. 11 is an X-ray diffraction profile fitting view of electroless Ni plating (F bath) according to the first embodiment of the present invention.
Figure 12:
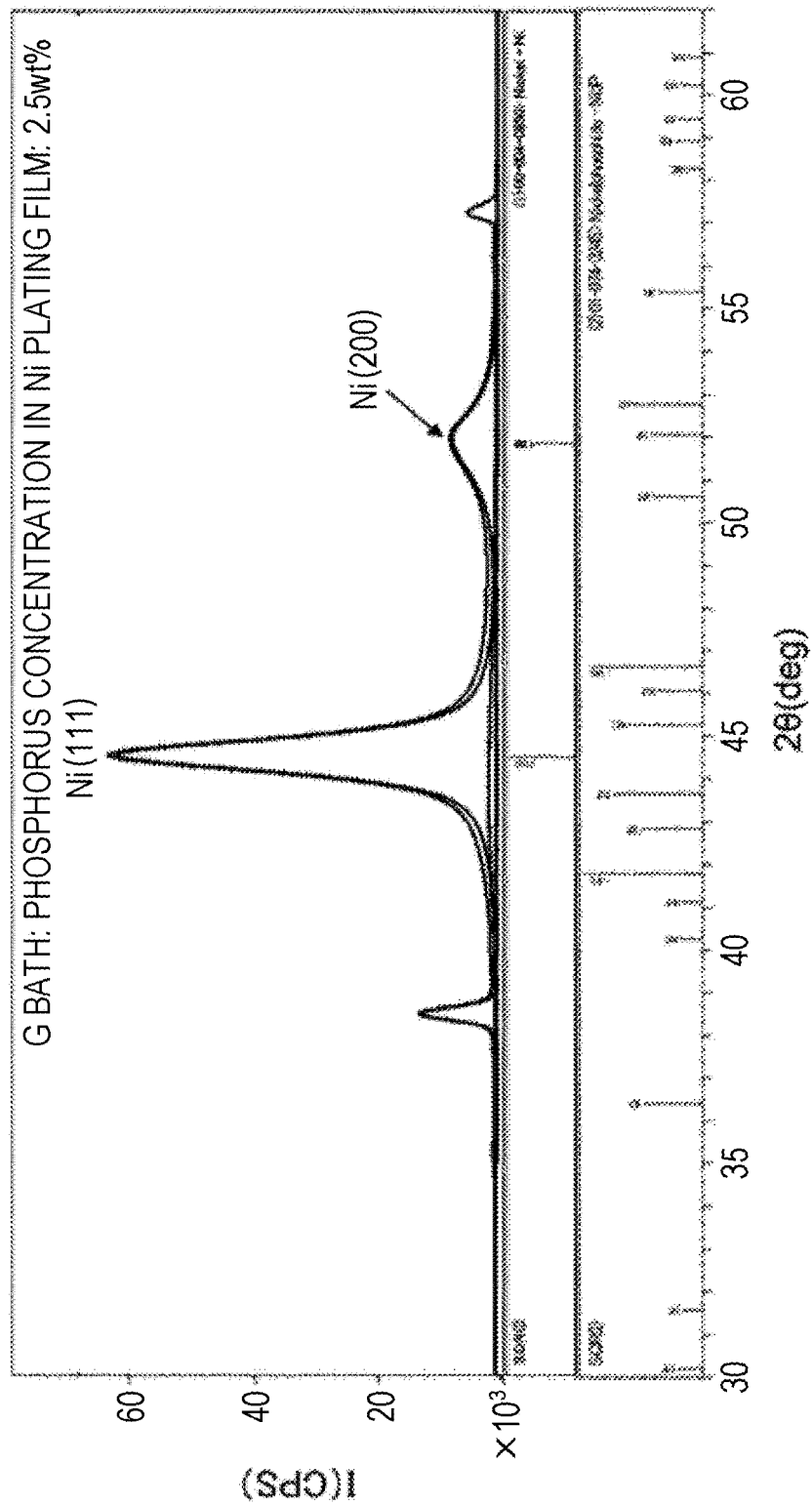
FIG. 12 is an X-ray diffraction profile fitting view of electroless Ni plating (G bath) according to the first embodiment of the present invention.

The Ni layer 104 is formed by an electroless plating method. FIG. 4 illustrates process flow of electroless Ni plating. Although not illustrated in FIGS. 3C and 4, in order to deposit electroless Ni plating only on the cathode electrode 112 in the embodiment, a surface protection tape is affixed to the anode electrode 109 side to perform the electroless Ni plating. In the case of depositing electroless Ni plating only on the anode electrode 109 side, a surface protection tape is affixed to the cathode electrode 112 side to perform the electroless Ni plating.

In the electroless Ni plating process, first, oil adhering to the surface of the second Al metal layer 106b is cleaned with an alkaline degreasing agent (Step 1). Next, the second Al metal layer 106b is etched with a strong alkaline solution based on sodium hydroxide (NaOH) to remove oxide coating (Step 2). Next, Al(OH)₃ and impurities generated at the time of removing the oxide coating are removed by acid washing (Step 3). Next, zincate treatment is performed to coat zinc (Zn) such that Ni substitution is quickly carried out in a plating solution (Step 4).

Here, in an electroless plating step illustrated in FIG. 4, the second Al metal layer 106b serving as a base electrode easily forms oxide coating, and thus, double zincate treatment in which zinc (Zn) substitution is repeated twice is performed in order to improve the adhesion with respect to the Ni plating film (Steps 5 and 6). Next, a Ni film is deposited by, for example, 3 µm by electroless Ni plating (Step 7). In the reaction of electroless Ni plating, hypophosphite which is a reducing agent is oxidized to phosphite.

At this time, plating is advanced by the following reaction in which electrons are released and Ni ions are reduced to form Ni (plating film).

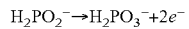

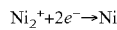

Thus, the electroless Ni plating film 104 contains phosphorus (P), and a film having different properties can be obtained depending on a difference in P content. In the electroless Ni plating film, the content of phosphorus (P) varies depending on a complexing agent and a pH concentration.

The semiconductor device 100 to be mounted on a power module, which is a main component of a power converter such as an inverter includes a power semiconductor chip and the ceramic insulating substrate 101 on which a wiring layer is formed with a conductive member 102 (for example, Cu), and the conductive member 102 is joined to the cathode electrode 112 on a back surface of the chip with a joining agent using cupric oxide (CuO) particles. In this joining step, multi-stage heating and pressurization are applied under reducing atmosphere. In the multi-stage heating in the joining step, for example, a heat load of 350° C. is applied to the power semiconductor chip. If this heat load causes a crack in the electroless Ni plating layer 104, copper diffuses from the junction layer to the power semiconductor chip so that there occur problems that an element leak current increases, an element withstand voltage deteriorates, and characteristics of the element fluctuate.

FIG. 5 illustrates experimental results of the phosphorus (P) concentration and the Ni crystallinity in the Ni plating film, studied by the inventors of the present application, when heat treatment at 350° C. has been performed after forming the electroless Ni plating film 104. Regarding the P concentration, the P concentration in the electroless Ni plating layer 104 has been analyzed by Auger electron spectroscopy. The Ni crystallinity has been obtained by a calculation formula of (a total sum of integrated intensities of crystalline peaks/a total sum of integrated intensities of all peaks)×100% in the range of 30≤2θ≤62 deg by X-ray diffraction.

From the results studied by the inventors of the present application, it has been found that there is a case where a crack is likely to occur depending on a type of an electroless Ni plating bath and heat treatment after plating deposition even in the case where the phosphorus concentration is equal to or higher than 4 wt % and lower than 6 wt % as in JP 2015-56532 A, and the Ni crystallinity of the Ni plating film needs to be high in addition to the phosphorus concentration in order to suppress the crack generation.

Based on the results, the concentration of phosphorus (P) in the Ni plating film needs to be 2.5 wt % to 6 wt % inclusive, and the crystallization rate of nickel (Ni) needs to be 70% to 95% inclusive in order to suppress the crack.

Each of FIGS. 6 to 12 illustrates profile fitting results of X-ray diffraction, studied by the inventors of the present application, when heat treatment at 350° C. has been performed after forming the electroless Ni plating film 104 in an A bath (FIG. 6) to a G bath (FIG. 12), respectively. Each of the A bath to the G bath is a plating bath set under a condition that a phosphorus (P) concentration in a Ni plating film is set to a concentration illustrated in each of the drawings.

In the A bath, the B bath, the C bath, and the D bath in which Ni crystallinity is equal to or lower than 70% and a crack of the plating of Ni plating film is generated, not only diffraction peaks of Ni (111) and Ni (200) but also diffraction peaks of Ni₃P (321) and (141) derived from a nickel-phosphorus compound are observed, and it is conceivable that a phase change is caused by heat treatment so that the crack is generated.

On the other hand, in the E bath, the F bath, and the G bath in which the Ni crystallinity is 70% or higher, the diffraction peaks of Ni (111) and Ni (200) are predominant and only a slight peak of Ni₃P (321) is observed, and it is conceivable that the crack generation is suppressed since the phase change of the Ni plating film caused by heat treatment is small.

Figure 13:
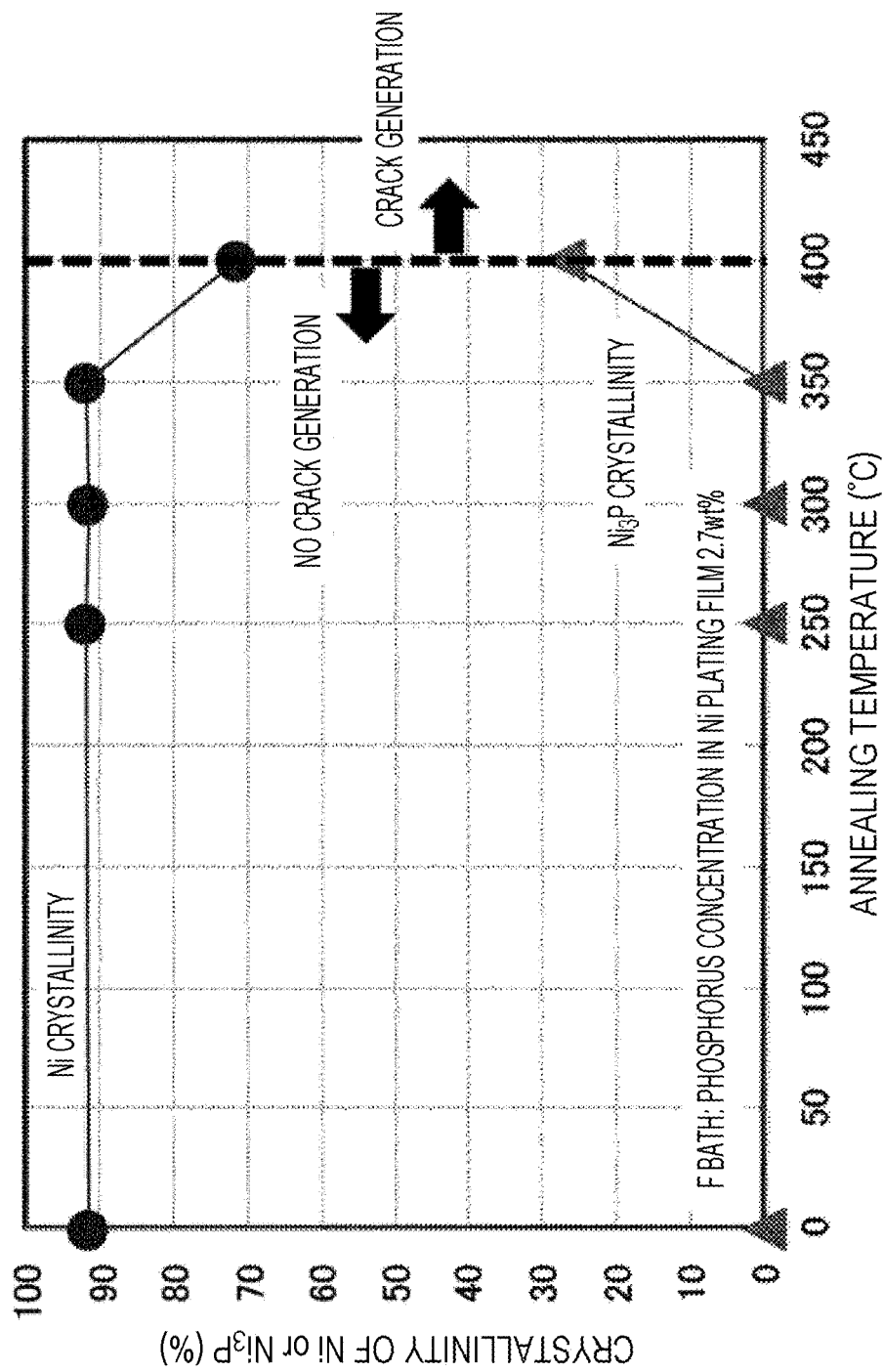
FIG. 13 is a characteristic view illustrating annealing temperature dependence of Ni crystallinity and $Ni_3P$ crystallinity in electroless Ni plating (F bath) deposition according to the first embodiment of the present invention.

FIG. 13 illustrates the annealing temperature dependence of the crystallinity after forming the electroless Ni plating film 104 using the F bath in which the phosphorus concentration of the Ni plating film is 2.7 wt %. The crystallinity of $Ni_3P$ is obtained by a calculation formula of (a total sum of integrated intensities of crystalline peaks of $Ni_3P$/a total sum of integrated intensities of all peaks)×100% using diffraction peaks of $Ni_3P$ in the range of $30 \leq 2\theta \leq 62$ deg by X-ray diffraction in the same manner as in the Ni crystallinity.

When the phosphorus (P) concentration is low and the Ni crystallinity is high immediately after forming the Ni plating film, the crack generation in the Ni plating film can be suppressed since the change of the Ni crystallinity is small and the phase change is small even by the subsequent heat treatment. On the other hand, when the heat load increases and the crystallinity of $Ni_3P$ which is a nickel-phosphorus compound, becomes high, a crack is generated.

Figure 14:
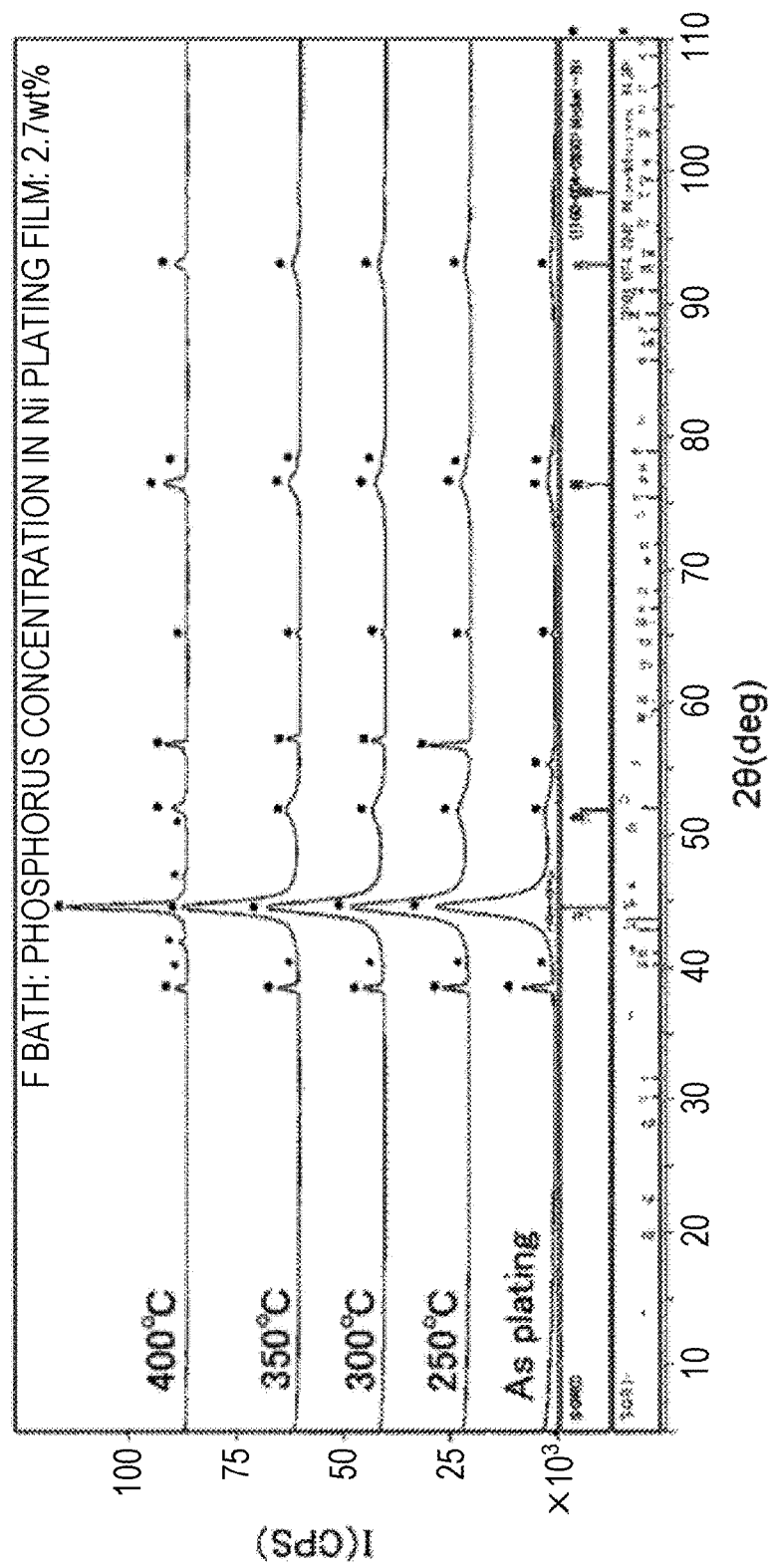
FIG. 14 is a characteristic view illustrating annealing temperature dependence of an X-ray diffraction profile of the electroless Ni plating (F bath) deposition according to the first embodiment of the present invention.

FIG. 14 illustrates the annealing temperature dependence of the X-ray diffraction profile after forming the electroless Ni plating film 104 using the F bath in which the phosphorus concentration of the Ni plating film is 2.7 wt %. Diffraction lines (111) and (200) of Ni can be confirmed at a stage immediately after the Ni plating deposition, and it is understood that the diffraction line becomes sharp when the heat load increases and the crystallization progresses as the temperature rises. When the annealing temperature reaches 400° C., $Ni_3P$, which is the nickel-phosphorus compound, is generated so that diffraction lines (321) and (141) of $Ni_3P$ can be confirmed.

Figure 15:
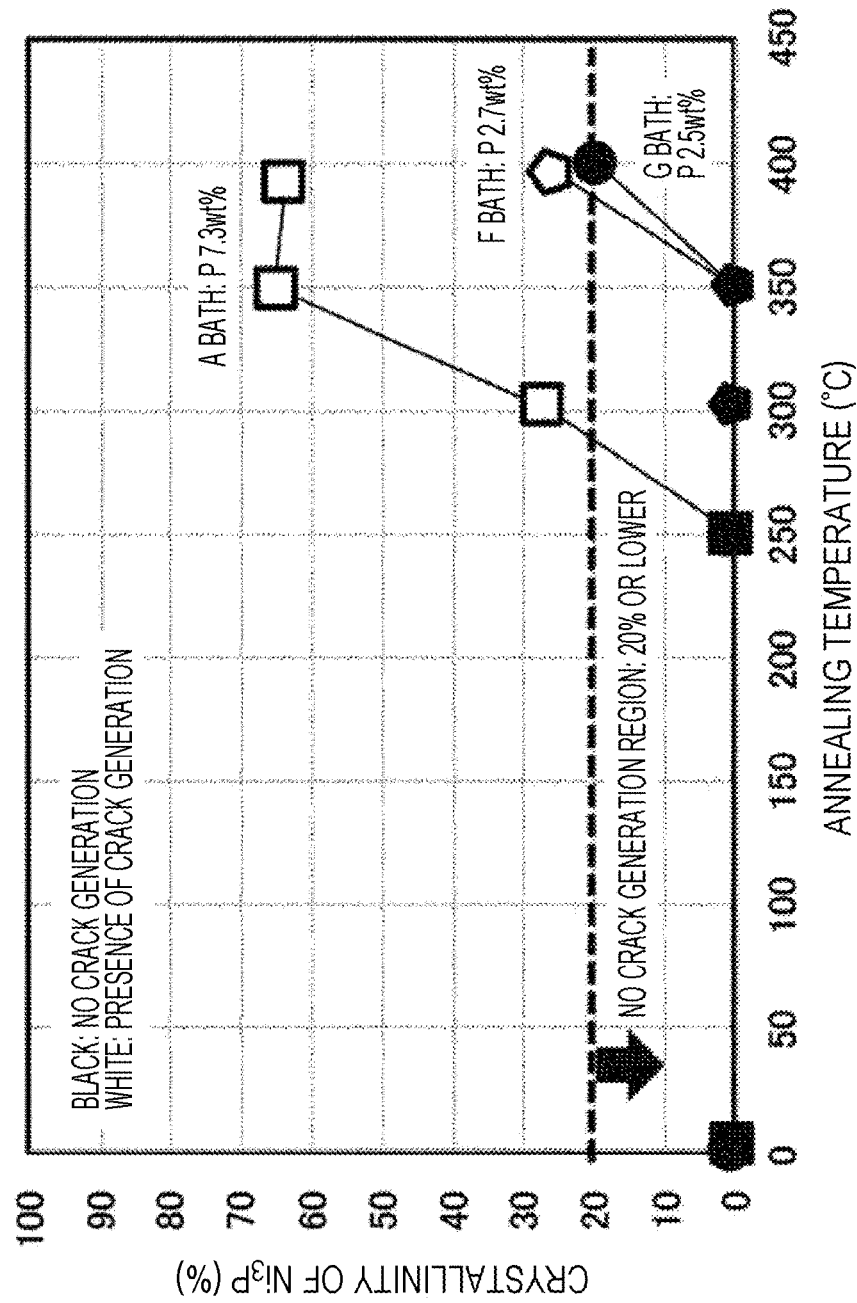
FIG. 15 is a characteristic view illustrating annealing temperature dependence of $Ni_3P$ crystallinity based on a difference in phosphorus concentration of electroless Ni plating according to the first embodiment of the present invention.

FIG. 15 illustrates the annealing temperature dependence of the crystallinity of $Ni_3P$ in electroless Ni plating films having different phosphorus (P) concentrations. In Ni plating with the A bath having a phosphorus concentration of 7.3 wt %, the crystallization of $Ni_3P$ starts at 250° C. or higher, the crystallinity of $Ni_3P$ is also high, and a crack is generated in the Ni plating film at 300° C. or higher. In Ni plating with the F bath having the phosphorus concentration of 2.7 wt %, the crystallization of $Ni_3P$ starts at 350° C. or higher, the crystallinity of $Ni_3P$ becomes 26% at 400° C., and a crack is generated in the Ni plating film. On the other hand, in Ni plating with the G bath having a phosphorus concentration of 2.5 wt %, the crystallization of $Ni_3P$ starts at 350° C. or higher, the crystallinity of $Ni_3P$ becomes 20% at 400° C., but no crack is generated in the Ni plating film. In this manner, $Ni_3P$, which is the nickel-phosphorus compound, is generated along with the increase in the annealing temperature, and the crack is generated in the Ni plating film when the crystallinity of $Ni_3P$ exceeds 20%.

As described above, according to the semiconductor device and the manufacturing method thereof of the present embodiment, the electroless Ni plating layer 104 contains nickel (Ni) and phosphorus (P) as the composition such that the concentration of phosphorus (P) is 2.5 wt % to 6 wt % inclusive and the crystallization rate of nickel (Ni) is 70% to 95% inclusive. As the crystallization rate of $Ni_3P$ which is the compound of nickel (Ni) and phosphorus (P) is set to 0% to 20% inclusive, it is possible to suppress the phase change of the Ni plating film and to obtain characteristics excellent in high heat resistance.

That is, it is possible to realize the highly reliable semiconductor device which has the electrode including the electroless Ni plating layer and in which the crack is hardly generated in the electroless Ni plating layer, and the manufacturing method thereof. As a result, it is possible to reduce a size and increase reliability of a power conversion apparatus on which the semiconductor device is mounted.

In the present embodiment, the "Ni layer (electroless Ni plating layer) 104 contains nickel (Ni) and phosphorus (P) as the composition, the concentration of phosphorus (P) is 2.5 wt % to 6 wt % inclusive, the crystallization rate of nickel (Ni) in the Ni layer (electroless Ni plating layer) 104 is 70% to 95% inclusive, and the crystallization rate of Ni3P which is the compound of nickel (Ni) and phosphorus (P) is 0% to 20% inclusive". However, although the degree of the effect decreases, it is possible to suppress the crack generation as compared with the related art by satisfying at least the conditions that the "phosphorus (P) concentration is 2.5 wt % to 6 wt % inclusive, and the crystallization rate of Ni3P in the first electroless Ni plating layer is 0% to 20% inclusive" among the above-described conditions.

Second Embodiment

Figure 16A:
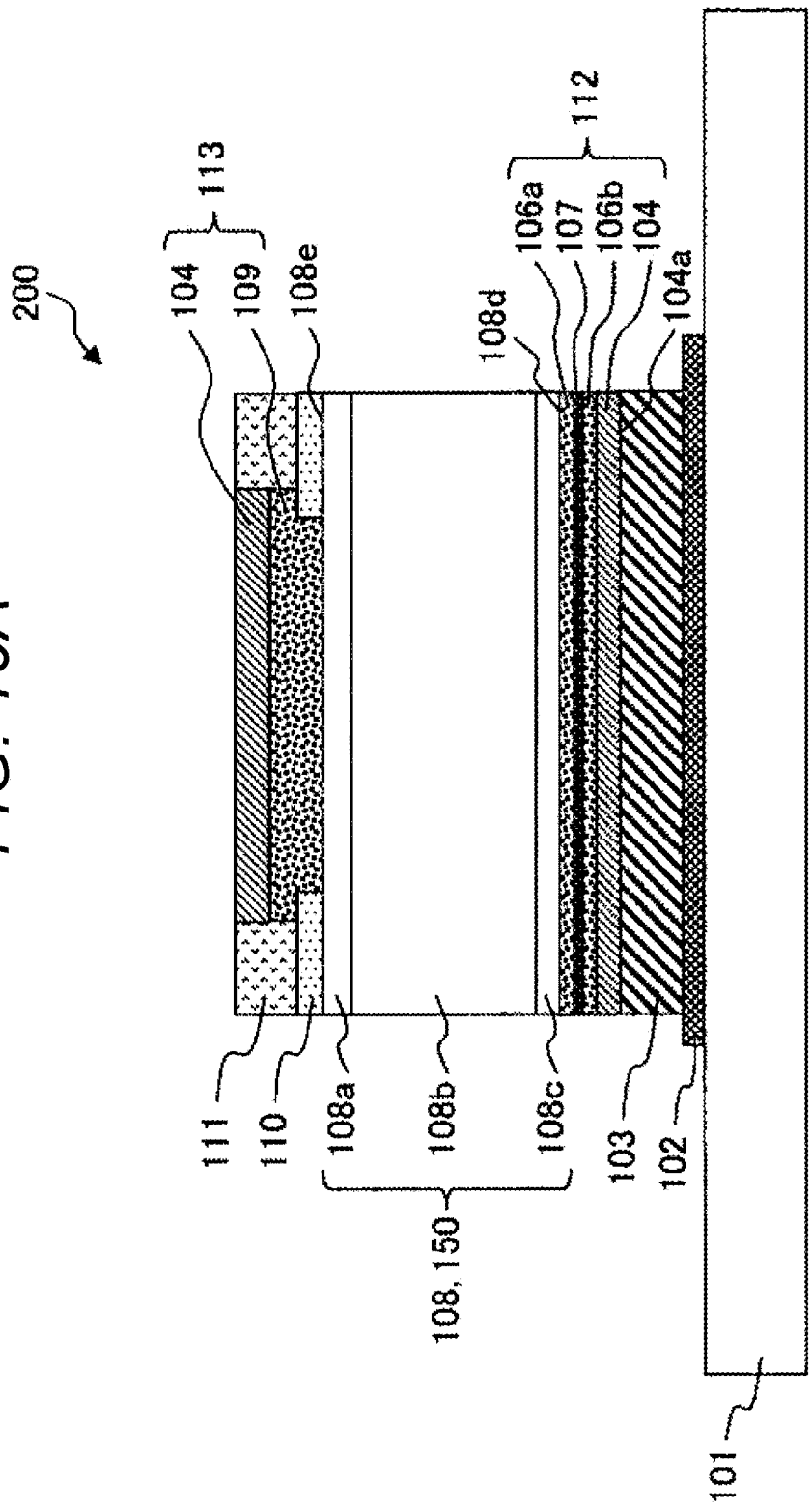
FIG. 16A is a cross-sectional view of a semiconductor device according to a second embodiment of the present invention.
Figure 16B:
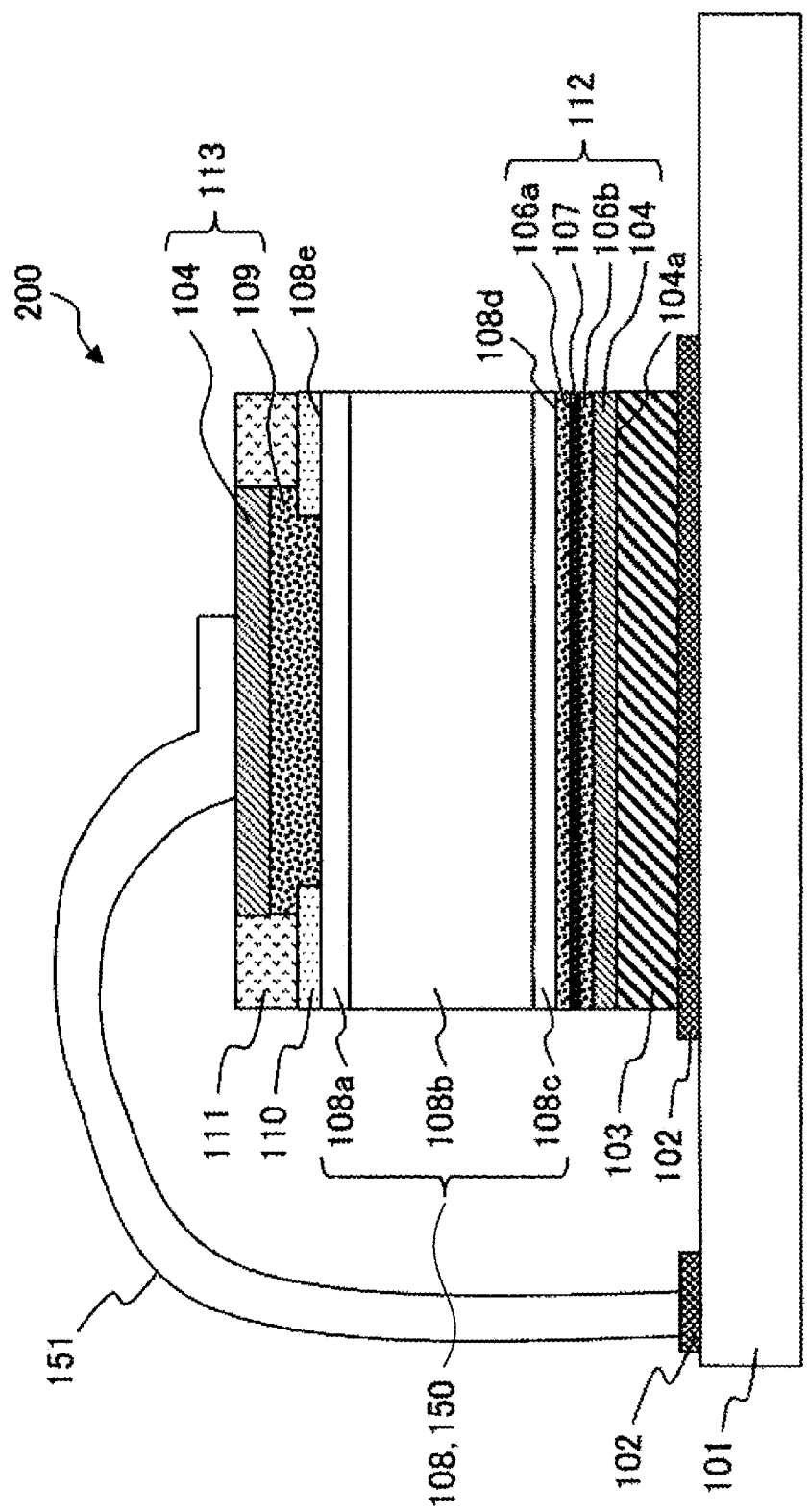
FIG. 16B is a cross-sectional view of the semiconductor device of FIG. 16A after wire bonding.

A semiconductor device and a manufacturing method thereof according to a second embodiment of the present invention will be described with reference to FIGS. 16A and 16B. FIG. 16A is a cross-sectional view of a semiconductor device 200 according to the second embodiment of the present invention. FIG. 16B is a cross-sectional view of the semiconductor device 200 in FIG. 16A after wire bonding.

The semiconductor device 200 of the present embodiment is an example of the case of being applied to a freewheel diode of a power semiconductor chip similarly to the first embodiment. Although a description will be given assuming a diode using an n type Si substrate hereinafter, the invention is not limited thereto. Even when a p type Si substrate is used, the invention can be handled in the same manner. Further, the invention can be handled in the same manner in an electrode structure of an IGBT that causes a current to flow in the vertical direction. Further, the invention can be handled in the same manner regarding a wide-gap semiconductor such as SiC, GaN, and GaO.

As illustrated in FIG. 16A, the semiconductor device 200 of the embodiment further includes an electrode structural body 113 of a second semiconductor chip in which an Al metal layer 109 made of Al or an Al alloy and a Ni layer 104 are formed in this order (from a lower layer side to an upper layer side of FIG. 16A) on a second surface 108e of the semiconductor substrate 108 on which the semiconductor element 150 is formed. The Ni layer 104 is an electroless Ni plating layer, contains nickel (Ni) and phosphorus (P) as a composition, and has a concentration of phosphorus (P) of 2.5 wt % to 6 wt % inclusive, which is similar to the Ni layer 104 of the electrode structural body 112 of the first semiconductor chip on the first surface 108d.

The electrode structural body 113 of the second semiconductor chip is formed on the second surface 108e opposite to the first surface 108d of the semiconductor substrate 108 on which the electrode structural body 112 of the first semiconductor chip is formed.

Further, a crystallization rate of nickel (Ni) in the Ni layer (electroless Ni plating layer) 104 is 70% to 95% inclusive, and a crystallization rate of $Ni_3P$ which is a compound of nickel (Ni) and phosphorus (P) is 0% to 20% inclusive.

In this manner, the electrode structural body 112 of the first semiconductor chip and the electrode structural body 113 of the second semiconductor chip are formed on both sides of the semiconductor substrate 108, and the conductive member 102 is joined to the electrode structural body 112 of the first semiconductor chip via the copper sintered layer 103 in the semiconductor device 200 of the present embodiment. Further, the electrode structural body 113 of the second semiconductor chip is connected to the conductive member 102 on the ceramic insulating substrate 101 by a bonding wire 151 as illustrated in FIG. 16B. That is, the electrode structural body 113 of the second semiconductor chip is a bonding pad (pad electrode) to which the bonding wire is joined.

Incidentally, the electrode structural body 113 of the second semiconductor chip is produced through the same steps as the production steps of the electrode structural body 112 of the first semiconductor chip described in FIGS. 2A to 3C of the first embodiment.

According to the semiconductor device and the manufacturing method thereof of the present embodiment, the similar electrode structural bodies (the electrode structural body 112 of the first semiconductor chip and the electrode structural body 113 of the second semiconductor chip) are provided on both the sides of the semiconductor substrate 108 to form the electrode films with good symmetry on the front surface and the back surface of the Si wafer 90, and thus, it is possible to reduce wafer warpage caused by stress of the electrode film and to improve manufacturability in addition to the effects of the first embodiment.

Further, aluminum crystal grains are coarsened in a surface electrode of the semiconductor chip due to heat generation along with a high-temperature operation of the power module, stress is applied to the surface electrode of the semiconductor chip due to a difference in linear thermal expansion coefficient with the semiconductor chip, and a crack develops in the surface electrode below a junction of an aluminum wire (bonding wire 151) so that reliability deteriorates. In order to prevent such a phenomenon, the stress generated on the surface electrode of the semiconductor chip is reduced, and nickel (Ni) having a linear thermal expansion coefficient close to silicon (Si) rather than aluminum (Al) is deposited on an aluminum electrode by electroless Ni plating, whereby it is possible to improve the high-temperature reliability of the power module.

Further, a Ni film with high Ni crystallinity and high hardness can be obtained and thus, it is possible to reduce mechanical damage to the semiconductor chip at the time of wire bonding.

Third Embodiment

Figure 17:
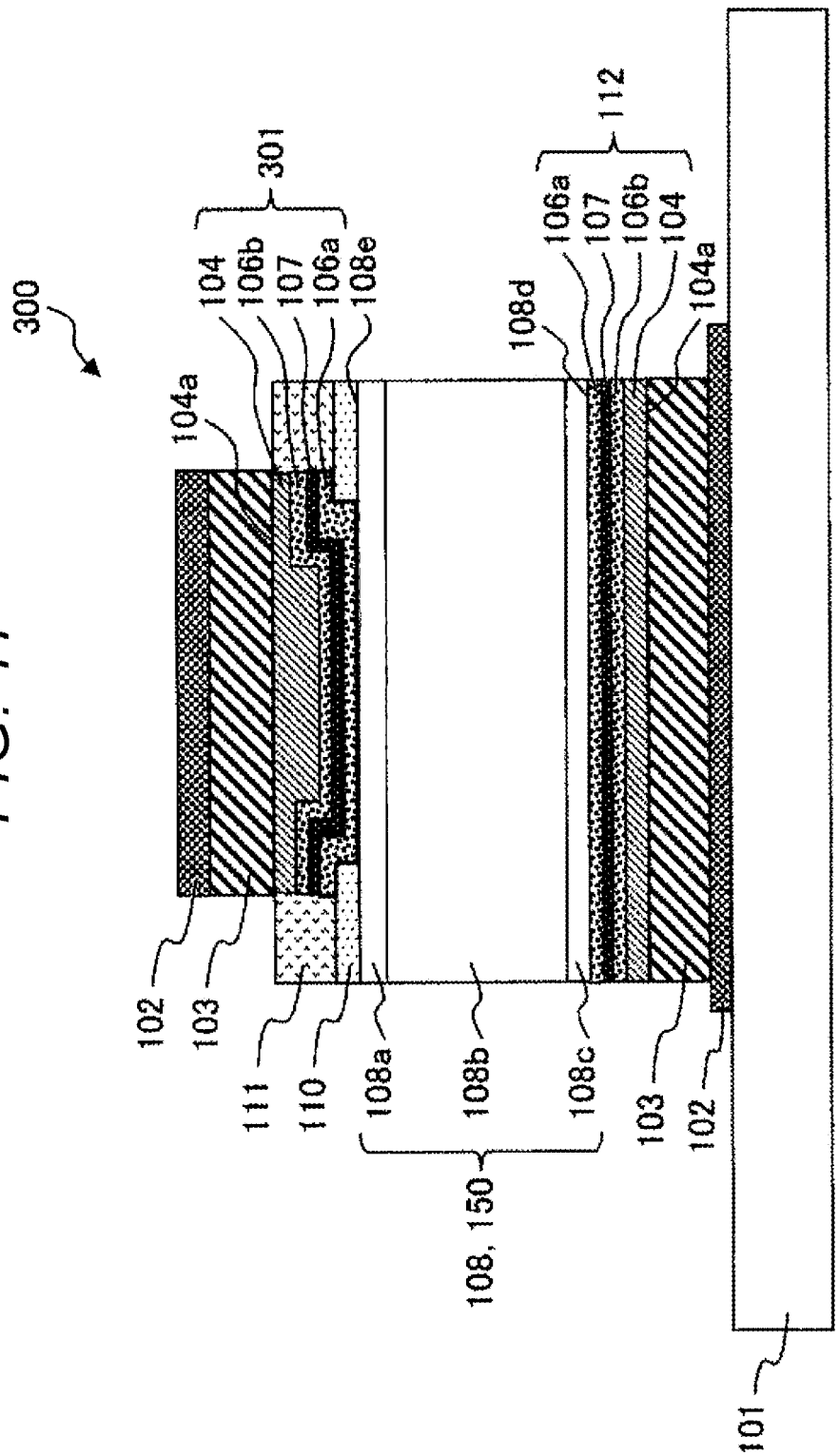
FIG. 17 is a cross-sectional view of a semiconductor device according to a third embodiment of the present invention.

A semiconductor device and a manufacturing method thereof according to a third embodiment of the present invention will be described with reference to FIG. 17. FIG. 17 is a cross-sectional view of a semiconductor device 300 according to the third embodiment of the present invention.

The semiconductor device 300 of the present embodiment is an example of the case of being applied to a freewheel diode of a power semiconductor chip similarly to the first embodiment. Although a description will be given assuming a diode using an n type Si substrate hereinafter, the invention is not limited thereto. Even when a p type Si substrate is used, the invention can be handled in the same manner. Further, the invention can be handled in the same manner in an electrode structure of an IGBT that causes a current to flow in the vertical direction. Further, the invention can be handled in the same manner regarding a wide-gap semiconductor such as SiC, GaN, and GaO.

As illustrated in FIG. 17, the semiconductor device 300 of the embodiment further includes: an electrode structural body 301 of a third semiconductor chip in which a first Al metal layer 106a made of Al or an Al alloy, a Cu diffusion prevention layer 107, a second Al metal layer 106b made of Al or an Al alloy, and a Ni layer 104 are formed in this order (from a lower layer side to an upper layer side of FIG. 17) on the second surface 108e of the semiconductor substrate 108 on which the semiconductor element 150 is formed; and a conductive member 102 which is arranged on a surface 104a of the Ni layer 104 of the electrode structural body 301 of the third semiconductor chip and joined to the electrode structural body 301 of the third semiconductor chip via a copper sintered layer 103. The Ni layer 104 is an electroless Ni plating layer, contains nickel (Ni) and phosphorus (P) as a composition, and has a concentration of phosphorus (P) of 2.5 wt % to 6 wt % inclusive, which is similar to the Ni layer 104 of the electrode structural body 112 of the first semiconductor chip on the first surface 108d. Further, a crystallization rate of nickel (Ni) in the Ni layer (electroless Ni plating layer) 104 is 70% to 95% inclusive, and a crystallization rate of $Ni_3P$ which is a compound of nickel (Ni) and phosphorus (P) is 0% to 20% inclusive.

In this manner, the electrode structural body 112 of the first semiconductor chip and the electrode structural body 301 of the third semiconductor chip are formed on both sides of the semiconductor substrate 108, and the conductive member 102 is joined to the electrode structural body 112 of the first semiconductor chip and the electrode structural body 301 of the third semiconductor chip via the copper sintered layer 103 in the semiconductor device 300 of the present embodiment.

Incidentally, the electrode structural body 112 of the first semiconductor chip and the electrode structural body 301 of the third semiconductor chip are arranged vertically symmetrically with the semiconductor substrate 108 (semiconductor element 150) interposed therebetween, and a film thickness of each of the films constituting the electrode structural body 112 of the first semiconductor chip is formed to be substantially the same as a film thickness of each of the films constituting the electrode structural body 301 of the third semiconductor chip which is symmetric.

Incidentally, the electrode structural body 301 of the third semiconductor chip is produced through the same steps as the production steps of the electrode structural body 112 of the first semiconductor chip described in FIGS. 2A to 3C of the first embodiment.

According to the semiconductor device and the manufacturing method thereof of the present embodiment, the similar electrode structural bodies (the electrode structural body 112 of the first semiconductor chip and the electrode structural body 301 of the third semiconductor chip) are provided on both the sides of the semiconductor substrate 108 to form the electrode films with good symmetry on the front surface and the back surface of the Si wafer 90, and thus, it is possible to reduce thermal stress caused by a difference in thermal expansion of each member which becomes prominent in a high-temperature environment in addition to the effects of the second embodiment. Ideally, the thermal stress generated in the copper sintered layer 103 is minimized by making a thermal expansion coefficient of the copper sintered layer 103 coincide with that of the conductive member 102, and long-term reliability is improved.

Fourth Embodiment

Figure 18:
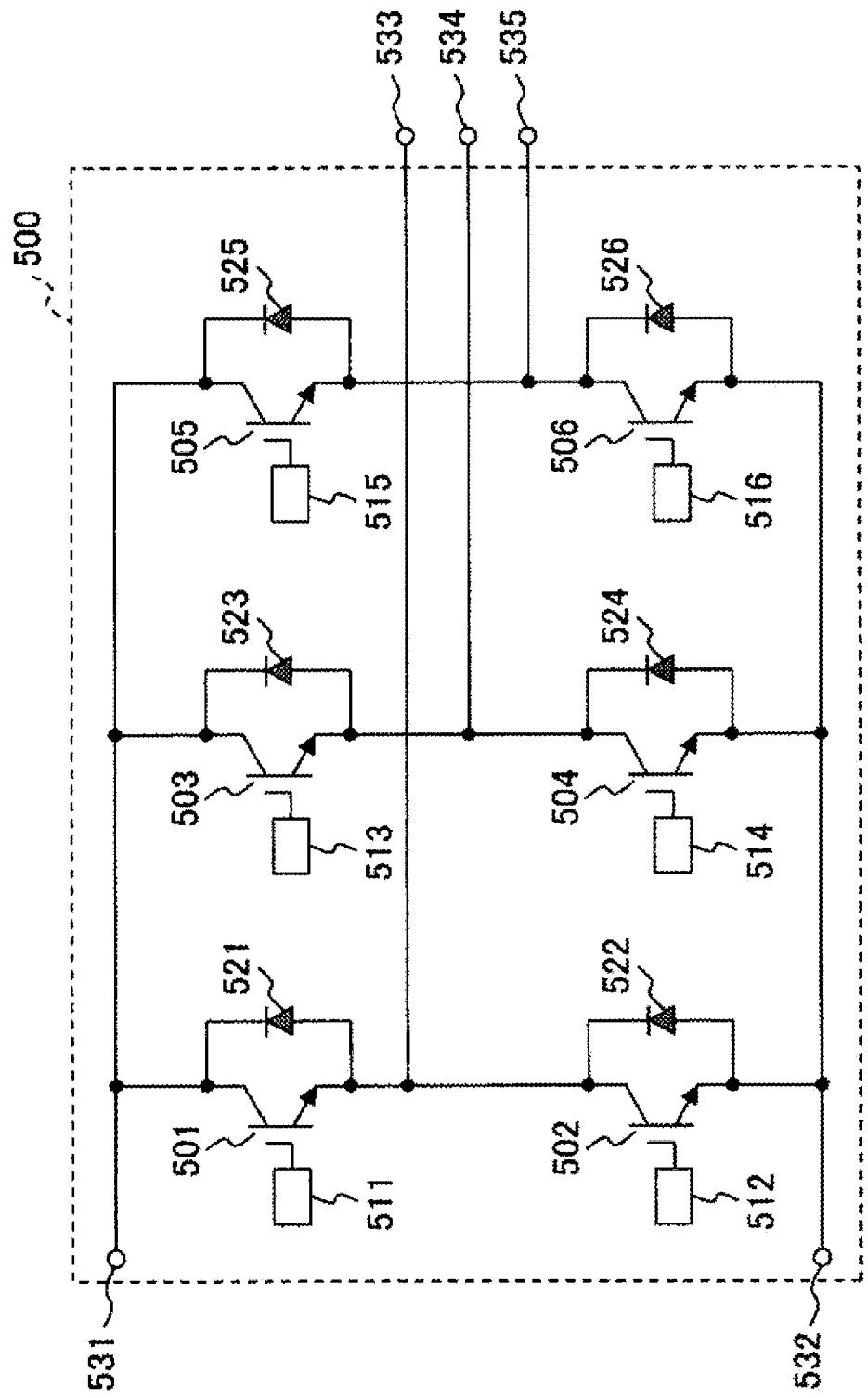
FIG. 18 is a circuit diagram illustrating a schematic configuration of a power conversion apparatus according to a fourth embodiment of the present invention.

A fourth embodiment in which the semiconductor device of the present invention is applied to a power conversion apparatus will be described with reference to FIG. 18. FIG. 18 is a circuit diagram illustrating a configuration of a power conversion apparatus 500 that adopts the semiconductor device 100 according to the first embodiment. FIG. 18 illustrates an example of a circuit configuration of the power conversion apparatus 500 according to the present embodiment and a connection relationship between a DC power supply and a three-phase AC motor (AC load). Here, a description is given assuming the case where the semiconductor device 100 according to the first embodiment is adopted, but the same description may be applied even in the case of adopting the semiconductor device 200 according to the second embodiment or the semiconductor device 300 according to the third embodiment.

In the power conversion apparatus 500 of the present embodiment, the semiconductor device 100 of the first embodiment is used as power switching elements 501 to 506. The power switching elements 501 to 506 are, for example, IGBTs.

As illustrated in FIG. 18, the power conversion apparatus 500 of the present embodiment includes a P terminal 531 and an N terminal 532, which are a pair of DC terminals, and a U terminal 533, a V terminal 534, and a W terminal 535 which are AC terminals of the same number as the number of phases of an AC output.

Further, a switching leg formed by the pair of power switching elements 501 and 502 connected in series and having the U terminal 533, connected to a series connection point thereof, as an output, is provided. Further, a switching leg which is formed by the power switching elements 503 and 504 having the same configurations and connected in series and has the V terminal 534 connected to such series connection point thereof, as an output, is provided. Further, a switching leg which is formed by the power switching elements 505 and 506 having the same configurations and connected in series and has the W terminal 535 connected to a series connection point thereof, as an output, is provided.

The three-phase switching legs formed by the power switching elements 501 to 506 are connected between the DC terminals of the P terminal 531 and the N terminal 532 and to which DC power is supplied from a DC power supply (not illustrated). The U terminal 533, the V terminal 534, and the W terminal 535, which are three-phase AC terminals of the power conversion apparatus 500, are connected, as a three-phase AC power supply, to a three-phase AC motor (not illustrated).

Diodes 521 to 526 are connected in reverse parallel to the power switching elements 501 to 506, respectively. Gate circuits 511 to 516 are connected to input terminals of gates of the power switching elements 501 to 506, formed of IGBTs, respectively, and the power switching elements 501 to 506 are controlled by the gate circuits 511 to 516, respectively. Incidentally, the gate circuits 511 to 516 are collectively controlled by an integrated control circuit (not illustrated).

The gate circuits 511 to 516 collectively and appropriately control the power switching elements 501 to 506 so that DC power of a DC power supply Vcc is converted into three-phase AC power and output from the U terminal 533, the V terminal 534, and the W terminal 535.

As the semiconductor device according to each of the embodiments of the first to third embodiments is applied to the power conversion apparatus 500, the long-term reliability of the power conversion apparatus 500 is improved. Further, the power conversion apparatus 500 can be mounted in a place under a high-temperature environment, and it is possible to secure the long-term reliability without providing a dedicated cooler. Alternatively, it is possible to reduce a size of the cooler and to reduce a size of the power conversion apparatus.

The present invention relates to the junction layer of the electrical junction (for example, the junction between the semiconductor element and the circuit member) in the electronic component, and particularly, is suitable for the application to the semiconductor device having the electroless Ni plating layer.

Further, the example in which the present invention is applied to the electroless Ni plating layers 104 of both the back surface electrode (the electrode structural body 112) and the front surface electrode (the electrode structural body 113 and the electrode structural body 301) of the semiconductor element 150 has been described in the second and third embodiments. However, it is also possible to produce the back surface electrode (the electrode structural body 112) using a conventional method and to apply the present invention only to the front surface electrode (the electrode structural body 113 and the electrode structural body 301).

Further, the case of the inverter device has been described as the example in which the semiconductor device of the present invention is applied to the power conversion apparatus in the fourth embodiment. However, the present invention is not limited thereto, and can be also applied to other power conversion apparatuses such as a DC-DC converter and an AC-DC converter.

Further, the present invention is not limited to the above-described embodiments and includes various modifications. For example, the above-described embodiments have been described in detail in order to describe the present invention in an easily understandable manner, and are not necessarily limited to one including the entire configuration that has been described above. Further, some configurations of a certain embodiment can be substituted by configurations of another embodiment, and further, a configuration of another embodiment can be also added to a configuration of a certain embodiment. Further, addition, deletion, or substitution of other configurations can be made with respect to some configurations of each embodiment.

Further, electrical wirings considered to be necessary for the description have been illustrated in the drawings, and all of the electrical wirings required as a product are not necessarily illustrated.

Incidentally, the present invention also has features described in the following Appendix 1 to Appendix 6.

APPENDIX 1

A manufacturing method of a semiconductor device, including:

(a) a step of forming a first aluminum (Al) metal film on a back surface of a semiconductor substrate by sputtering;

(b) a step of forming a titanium (Ti) film to serve as a Cu diffusion prevention layer on the first aluminum (Al) metal film by sputtering after the step (a);

(c) a step of forming a second aluminum (Al) metal film on the titanium (Ti) film by sputtering after the step (b); and (d) a step of forming a nickel (Ni) film on the second aluminum (Al) metal film by an electroless plating method after the step (c), in which the nickel (Ni) film contains nickel (Ni) and phosphorus (P) as a composition, a concentration of the phosphorus (P) is 2.5 wt % to 6 wt % inclusive, and a crystallization rate of $Ni_3P$ in the nickel (Ni) film is 0% to 20% inclusive.

APPENDIX 2

The manufacturing method of a semiconductor device according to Appendix 1, in which a crystallization rate of nickel (Ni) is 70% to 95% inclusive in the nickel (Ni) film.

APPENDIX 3

A manufacturing method of a semiconductor device, including:
(a) a step of forming an aluminum (Al) metal film on a front surface of a semiconductor substrate by sputtering; and
(b) a step of forming a nickel (Ni) film on the aluminum (Al) metal film by an electroless plating method after the step (a), in which
the nickel (Ni) film contains nickel (Ni) and phosphorus (P) as a composition, a concentration of the phosphorus (P) is 2.5 wt % to 6 wt % inclusive, and a crystallization rate of $Ni_3P$ in the nickel (Ni) film is 0% to 20% inclusive.

APPENDIX 4

The manufacturing method of a semiconductor device according to Appendix 3, in which
a crystallization rate of nickel (Ni) is 70% to 95% inclusive in the nickel (Ni) film.

APPENDIX 5

The manufacturing method of a semiconductor device according to Appendix 1, further including:
(e) a step of forming the first aluminum (Al) metal film on a front surface of the semiconductor substrate by sputtering before the step (a) or after the step (d);
(f) a step of forming a titanium (Ti) film to serve as the Cu diffusion prevention layer on the first aluminum (Al) metal film by sputtering after the step (e);
(g) a step of forming the second aluminum (Al) metal film on the titanium (Ti) film by sputtering after the step (f); and
(h) a step of forming a nickel (Ni) film on the second aluminum (Al) metal film by an electroless plating method after the step (g), in which
the nickel (Ni) film contains nickel (Ni) and phosphorus (P) as a composition, a concentration of the phosphorus (P) is 2.5 wt % to 6 wt % inclusive, and a crystallization rate of $Ni_3P$ in the nickel (Ni) film is 0% to 20% inclusive.

APPENDIX 6

The manufacturing method of a semiconductor device according to Appendix 5, in which
a crystallization rate of nickel (Ni) is 70% to 95% inclusive in the nickel (Ni) film.

What is claimed is:
1. A semiconductor device comprising:
a semiconductor element; and
a first electrode formed on a first surface of the semiconductor element, wherein
the first electrode has a stacked structure including a first electroless Ni plating layer,
the first electroless Ni plating layer contains nickel (Ni) and phosphorus (P) as a composition, and
a phosphorus (P) concentration of the first electroless Ni plating layer is 2.5 wt % to 6 wt % inclusive, and a crystallization rate of $Ni_3P$ in the first electroless Ni plating layer is 0% to 20% inclusive.
2. The semiconductor device according to claim 1, wherein
the first electroless Ni plating layer has a crystallization rate of nickel (Ni) of 70% to 95% inclusive.
3. The semiconductor device according to claim 1, wherein
the first electroless Ni plating layer is arranged on a side opposite to the first surface in the first electrode and is joined to a conductive member via a copper sintered layer.
4. The semiconductor device according to claim 1, further comprising:
a second electrode formed on a second surface on a side opposite to the first surface of the semiconductor element, wherein
the second electrode has a stacked structure including a second electroless Ni plating layer,
the second electroless Ni plating layer contains nickel (Ni) and phosphorus (P) as a composition, and
a phosphorus (P) concentration of the second electroless Ni plating layer is 2.5 wt % to 6 wt % inclusive, and a crystallization rate of $Ni_3P$ in the second electroless Ni plating layer is 0% to 20% inclusive.
5. The semiconductor device according to claim 4, wherein
the second electroless Ni plating layer has a crystallization rate of nickel (Ni) of 70% to 95% inclusive.
6. The semiconductor device according to claim 4, wherein
the second electroless Ni plating layer is arranged on a side opposite to the second surface in the second electrode and is joined to a conductive member via a copper sintered layer.
7. The semiconductor device according to claim 4, wherein
the stacked structure of the first electrode and the stacked structure of the second electrode are stacked structures arranged symmetrically with the semiconductor element interposed therebetween, and
a film thickness of a film forming the stacked structure of the first electrode is substantially identical to a film thickness of a film forming the stacked structure of the second electrode which is symmetric.
8. The semiconductor device according to claim 4, wherein
the second electrode is a bonding pad to which a bonding wire is joined.
9. A power conversion apparatus comprising:
a pair of DC terminals;
AC terminals as many as the number of phases of an AC output;
switching legs as many as the number of the phases of the AC output, the switching legs connected between the pair of DC terminals such that two parallel circuits each having a switching element and a diode having a polarity opposite to a polarity of the switching element are connected in series; and
a gate circuit which controls the switching element, wherein
the switching element is the semiconductor device according to claim 1.
10. The power conversion apparatus according to claim 9, wherein
the first electroless Ni plating layer has a crystallization rate of nickel (Ni) of 70% to 95% inclusive.
11. The power conversion apparatus according to claim 9, wherein
the first electroless Ni plating layer is arranged on a side opposite to the first surface in the first electrode and is joined to a conductive member via a copper sintered layer.
12. The power conversion apparatus according to claim 9, further comprising:

a second electrode formed on a second surface on a side opposite to the first surface of the semiconductor element, wherein the second electrode has a stacked structure including a second electroless Ni plating layer, the second electroless Ni plating layer contains nickel (Ni) and phosphorus (P) as a composition, and a phosphorus (P) concentration of the second electroless Ni plating layer is 2.5 wt % to 6 wt % inclusive, and a crystallization rate of $Ni_3P$ in the second electroless Ni plating layer is 0% to 20% inclusive.

13. The power conversion apparatus according to claim 12, wherein the second electroless Ni plating layer has a crystallization rate of nickel (Ni) of 70% to 95% inclusive.

14. The power conversion apparatus according to claim 12, wherein the second electroless Ni plating layer is arranged on a side opposite to the second surface in the second electrode and is joined to a conductive member via a copper sintered layer.

15. The power conversion apparatus according to claim 12, wherein the stacked structure of the first electrode and the stacked structure of the second electrode are stacked structures arranged symmetrically with the semiconductor element interposed therebetween, and a film thickness of a film forming the stacked structure of the first electrode is substantially identical to a film thickness of a film forming the stacked structure of the second electrode which is symmetric.

16. The power conversion apparatus according to claim 12, wherein the second electrode is a bonding pad to which a bonding wire is joined.

* * * * *